United States Patent
Koo et al.

(10) Patent No.: US 11,343,909 B2
(45) Date of Patent: May 24, 2022

(54) FLEXIBLE DISPLAY UNIT AND MOBILE TERMINAL INCLUDING SAME

(71) Applicant: LG ELECTRONICS INC., Seoul (KR)

(72) Inventors: Hyungmo Koo, Seoul (KR); Seyong Kim, Seoul (KR); Minchul Lee, Seoul (KR); Seunggeun Lim, Seoul (KR); Sunghan Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 210 days.

(21) Appl. No.: 16/759,972

(22) PCT Filed: Feb. 19, 2018

(86) PCT No.: PCT/KR2018/001991
§ 371 (c)(1),
(2) Date: Apr. 28, 2020

(87) PCT Pub. No.: WO2019/088373
PCT Pub. Date: May 9, 2019

(65) Prior Publication Data
US 2021/0181798 A1    Jun. 17, 2021

(30) Foreign Application Priority Data

Nov. 1, 2017   (KR) ........................ 10-2017-0144870

(51) Int. Cl.
*H05K 1/02* (2006.01)
*H05K 1/03* (2006.01)
(Continued)

(52) U.S. Cl.
CPC ..... *H05K 1/0281* (2013.01); *G02F 1/133305* (2013.01); *G06F 1/1652* (2013.01);
(Continued)

(58) Field of Classification Search
CPC ............ G02F 1/133305; G06F 1/1652; G06F 1/1681; G09F 9/301; H04M 1/0216;
(Continued)

(56) References Cited

U.S. PATENT DOCUMENTS

| 9,521,748 B1 | 12/2016 | Bergman et al. |
| 2013/0010405 A1 | 1/2013 | Rothkopf et al. |

(Continued)

FOREIGN PATENT DOCUMENTS

| CN | 104347000 | 2/2015 |
| CN | 105491194 | 4/2016 |

(Continued)

OTHER PUBLICATIONS

PCT International Application No. PCT/KR2018/001991, International Search Report dated Jul. 27, 2018, 2 pages.

(Continued)

*Primary Examiner* — Nelson M Rosario
(74) *Attorney, Agent, or Firm* — Lee Hong Degerman Kang & Waimey

(57) ABSTRACT

The present disclosure provides a display unit including: a flexible display formed to be elastically deformable; and a flexible portion comprising a flexible frame coupled to the rear surface of the flexible display, wherein the flexible frame is configured to have first holes repeatedly formed therethrough such that the flexible frame can be bent maximally to a first curvature; and a rigid portion disposed on at least one side of the flexible portion, wherein the flexible frame is made of a titanium material.

19 Claims, 19 Drawing Sheets

(51) Int. Cl.
*H05K 5/00* (2006.01)
*G02F 1/1333* (2006.01)
*G06F 1/16* (2006.01)
*G09F 9/30* (2006.01)
*H04M 1/02* (2006.01)

(52) U.S. Cl.
CPC ............ *G06F 1/1681* (2013.01); *G09F 9/301* (2013.01); *H04M 1/0216* (2013.01); *H04M 1/0268* (2013.01); *H05K 1/0306* (2013.01); *H05K 5/0017* (2013.01)

(58) Field of Classification Search
CPC . H04M 1/0268; H05K 1/0281; H05K 1/0306; H05K 5/0017
See application file for complete search history.

(56) References Cited

U.S. PATENT DOCUMENTS

| | | | |
|---|---|---|---|
| 2015/0043174 A1* | 2/2015 | Han | G06F 1/1652 361/749 |
| 2015/0378391 A1 | 12/2015 | Huitema et al. | |
| 2016/0104850 A1* | 4/2016 | Joo | B32B 7/02 257/82 |
| 2016/0299532 A1 | 10/2016 | Gheorghiu et al. | |
| 2016/0357052 A1 | 12/2016 | Kim et al. | |

FOREIGN PATENT DOCUMENTS

| | | |
|---|---|---|
| CN | 105514115 | 4/2016 |
| CN | 105635360 | 6/2016 |
| CN | 106031308 | 10/2016 |
| CN | 106774817 | 5/2017 |
| CN | 107180849 | 9/2017 |
| CN | 107305906 | 10/2017 |
| KR | 20150017819 | 2/2015 |
| KR | 20160042288 | 4/2016 |
| KR | 20160097034 | 8/2016 |
| KR | 20160124541 | 10/2016 |
| KR | 20160144105 | 12/2016 |
| KR | 20170089192 | 8/2017 |

OTHER PUBLICATIONS

The State Intellectual Property Office of the People's Republic of China Application Serial No. 201880071531.6, Office Action dated Nov. 2, 2020, 14 pages.
U.S. Appl. No. 15/880,356, Office Action dated Sep. 20, 2018, 26 pages.
U.S. Appl. No. 15/880,356, Notice of Allowance dated Feb. 20, 2019, 12 pages.
Korean Intellectual Property Office Application No. 10-2017-0144870, Office Action dated Oct. 15, 2021, 5 pages.
European Patent Office Application Serial No. 18873356.2, Search Report dated Nov. 16, 2021, 15 pages.
State Intellectual Property Office of the People's Republic of China Application Serial No. 201880071531.6, Notice of Allowance dated May 26, 2021, 7 pages.
Intellectual Property Office of India Application Serial No. 202037022472, Office Action dated Jun. 2, 2021, 5 page.
European Patent Office Application Serial No. 18873356.2, Search Report dated Jun. 30, 2021, 22 pages.

* cited by examiner

FIG. 7
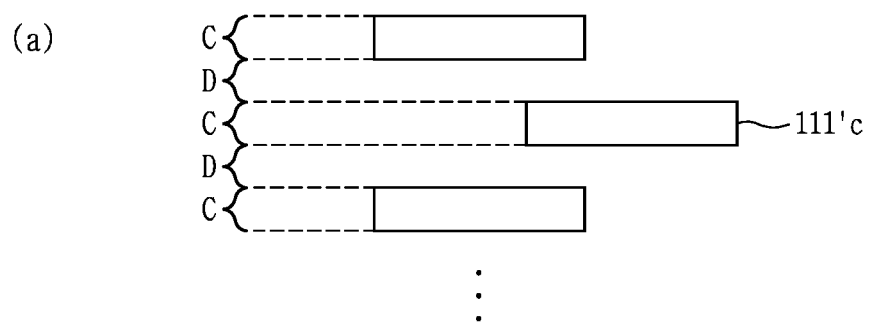
(a)
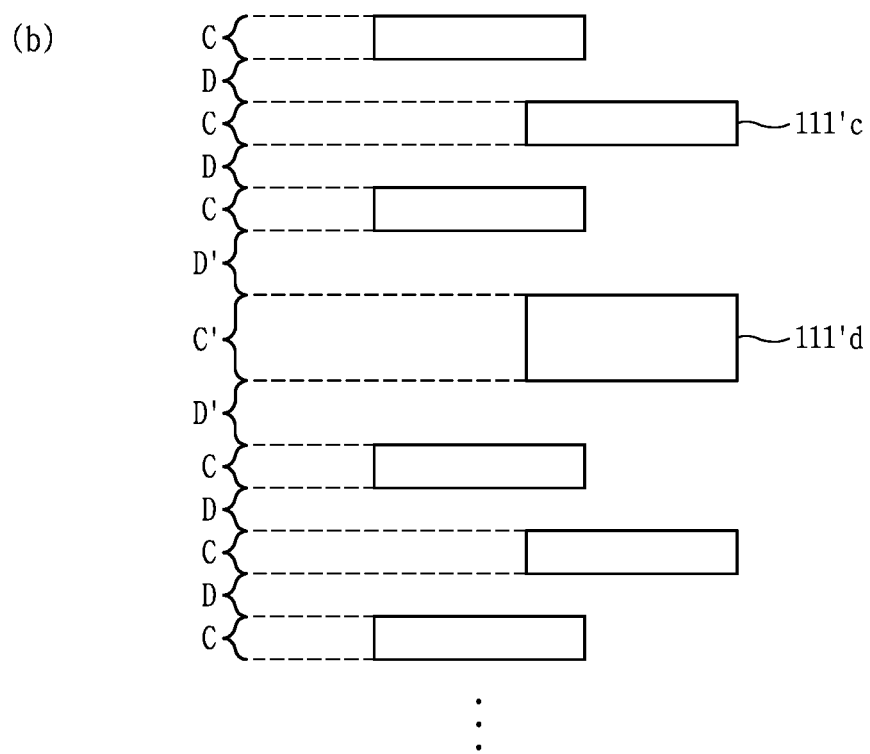
(b)

FIG. 22
(a)
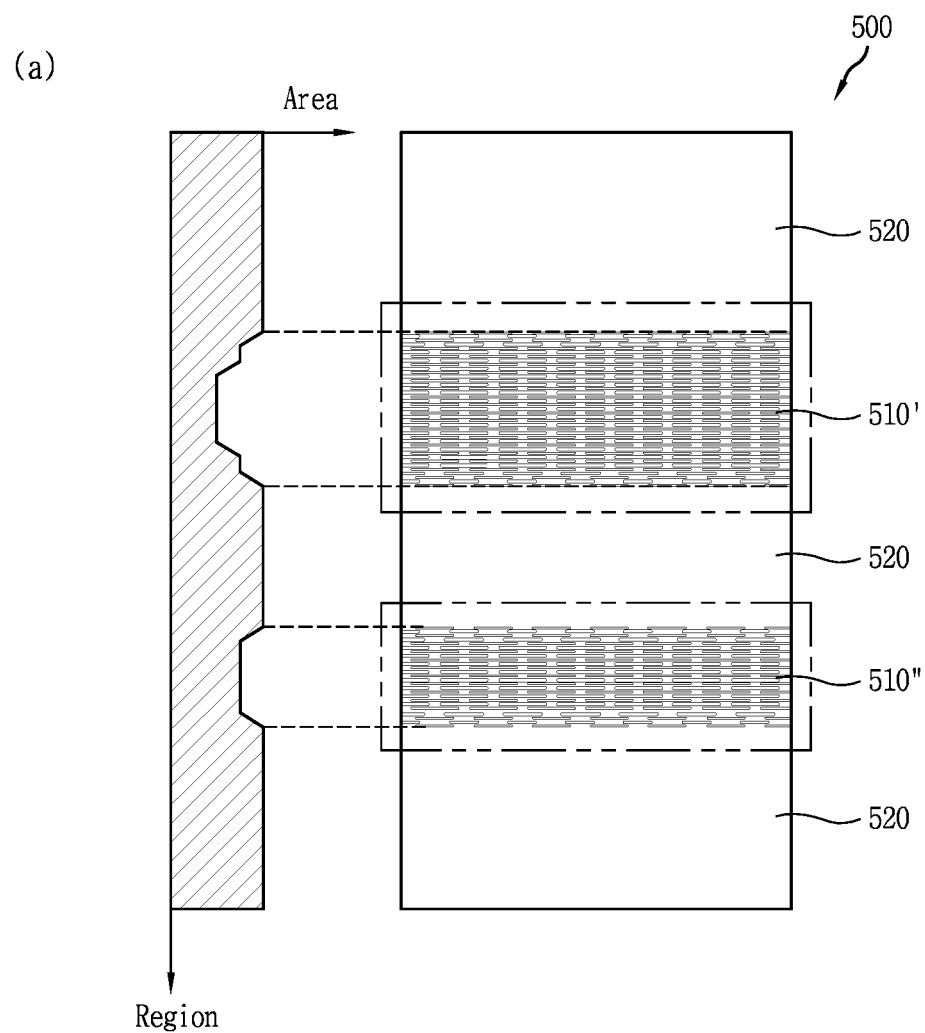
(b)
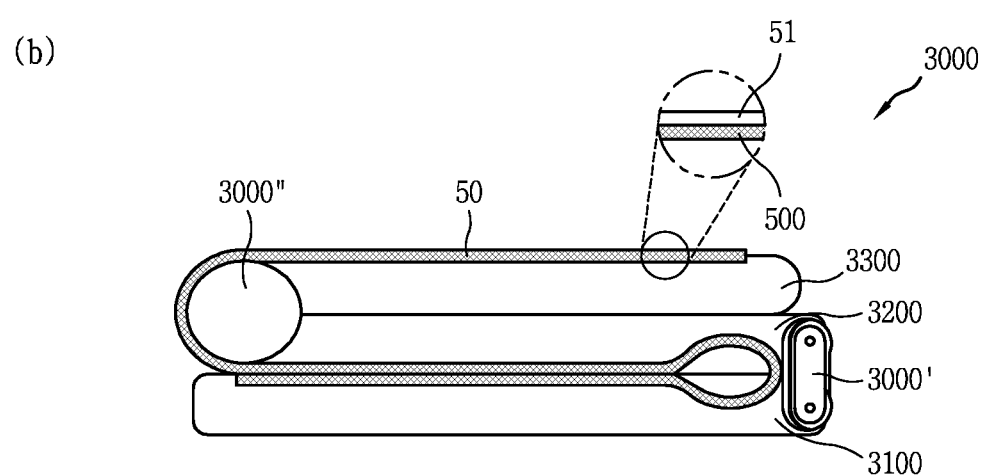

FLEXIBLE DISPLAY UNIT AND MOBILE TERMINAL INCLUDING SAME

CROSS-REFERENCE TO RELATED APPLICATIONS

This application is the National Stage filing under 35 U.S.C. 371 of International Application No. PCT/KR2018/001991, filed on Feb. 19, 2018, which claims the benefit of earlier filing date and right of priority to Korean Application No. 10-2017-0144870, filed on Nov. 1, 2017, the contents of which are all hereby incorporated by reference herein in their entirety.

BACKGROUND OF THE INVENTION

1. Field of the Invention

The present disclosure relates to a flexible display unit configured to be elastically deformable between a flat state and a bent state at a maximum curvature, and a mobile terminal having the same.

2. Description of the Related Art

A portable electronic device (hereinafter, mobile terminal) such as a communication terminal, a multimedia device, a portable computer, a game machine, and a photographing apparatus has a display for displaying image information. The mobile terminal may have a folding structure that can be folded to a smaller size for convenience of carrying. In this type of mobile terminal, two bodies are connected by a folding structure (for example, a hinge portion).

Displays in the related art have a non-foldable structure, and thus a structure in which a display is disposed over two whole bodies that are foldably connected to each other cannot be implemented. Therefore, a substantially large screen cannot be applied to a mobile terminal with a folding structure.

However, in recent years, as a flexible display capable of bending has been developed, research has been carried out to apply a flexible display to a mobile terminal having a folding structure. In this case, a flexible display may be disposed over two whole bodies across a folding structure, thereby implementing a large screen. However, even with a flexible display capable of bending, the flexible display itself may be broken when it is completely bent (i.e., bent angularly), and thus a structure capable of limiting a curvature radius of the flexible display when folding the mobile terminal is required.

In order to allow the flexible display to be bent at a preset curvature, a structure in which a flexible frame is laminated with a flexible display is used. However, flexible frames developed until now has only a structure in which one portion thereof can be curved at a specific curvature, but a structure in which two adjacent portions are connected smoothly while being configured to allow bending at different maximum curvatures has not been proposed.

In particular, when the two adjacent portions have different curvatures, a breakage of the flexible display may occur due to a change in curvature at the boundary. Therefore, studies on a flexible frame capable of smoothly connecting two adjacent portions having different curvatures have been carried out.

On the other hand, stainless steel is generally used as the flexible frame. However, stainless steel is not an optimal material from the viewpoint of restoration because the yield strain is not so large. In particular, in the case of a flexible frame made of stainless steel, when the flexible display is bent, it may not be flattened again, thereby causing a problem in which a surface of the flexible display undulates like a wave.

In addition, when an impact is applied to the flexible display in case where the flexible frame is formed of a metal material, the flexible frame may not absorb the impact, thereby causing a problem in which the flexible display is damaged.

SUMMARY OF THE INVENTION

A first object of the present disclosure is to provide a flexible frame laminated with a flexible display to bend two adjacent portions of the flexible display at different maximum curvatures in accordance with shape deformation.

A second object of the present disclosure is to provide a design method capable of adjusting a degree of bending and a repulsive force of the flexible frame.

A third object of the present disclosure is to provide a flexible frame capable of smoothly connecting two adjacent portions having different curvatures of a flexible display.

A fourth object of the present disclosure is to provide a flexible frame capable of restoring a flexible display to a flat state even when the bending and restoration of the flexible display are repeated, thereby allowing the flexible display to be flattened all the time.

A fifth object of the present disclosure is to provide a laminated structure of a flexible display and a flexible frame capable of absorbing an impact applied to the flexible display.

In order to accomplish the first object of the present disclosure, a flexible frame may be provided with a flexible region, and the flexible region may include a first flexible portion having first holes formed repeatedly and bendable up to a state having a maximum first curvature; and a second flexible portion having second holes formed repeatedly in parallel to the first holes, and bendable up to a state having a maximum second curvature, wherein a total area occupied by the first holes per unit area in the first flexible portion is larger than a total area occupied by the second holes per unit area in the second flexible portion, so that the first curvature is larger than the second curvature.

The first holes may be repeatedly formed along a widthwise direction and a lengthwise direction of the flexible region which intersect with each other, wherein the second holes are repeatedly formed along the widthwise direction and the lengthwise direction of the flexible region which intersect each other.

The first holes may be arranged in a zigzag form while partially overlapping each other along the lengthwise direction of the flexible region, wherein the second holes are arranged in a zigzag form while partially overlapping each other along the lengthwise direction of the flexible region.

A length of each overlapped portion of the first holes may be longer than a length of each overlapped portion of the second holes.

The first holes and the second holes respectively may include a plurality of holes having the same size and spaced apart from one another at preset intervals.

The first holes and the second holes may further include respectively another hole having at least one of a size and a spaced interval different from those of the plurality of holes.

The second object of the present disclosure may be accomplished by adjusting a total area occupied by holes per unit area in each flexible portion.

The third object of the present disclosure may be accomplished by a connecting portion having third holes formed repeatedly between the first flexible portion and the second flexible portion in parallel to the first and second holes.

A total area occupied by the third holes per unit area in the connecting portion may be smaller than the total area occupied by the first holes per unit area in the first flexible portion and larger than the total area occupied by the second holes per unit area in the second flexible portion.

A length of each of the third holes may be shorter than a length of the first hole and longer than a length of the second hole.

The length of each of the third holes may gradually decrease from the first flexible portion toward the second flexible portion.

The third holes may be arranged in a zigzag form while partially overlapping each other along the lengthwise direction of the flexible region, and wherein a length of each overlapped portion of the third holes may be shorter than a length of each overlapped portion of the first holes and longer than a length of each overlapped portion of the second holes.

A length of each overlapped portion of the third holes may gradually decrease from the first flexible portion toward the second flexible portion.

The third object of the present disclosure may be accomplished by a boundary portion having fourth holes formed repeatedly between the second flexible portion and a rigid portion, the rigid portion located on one side of the second flexible portion.

A total area occupied by the fourth holes per unit area in the boundary portion is smaller than the total area occupied by the second holes per unit area in the second flexible portion.

A length of each of the fourth holes may be shorter than a length of the second hole.

A length of a hole of the fourth holes, the hole adjacent to the rigid portion, may be shorter than a length of another hole of the fourth holes, the another hole adjacent to the second flexible portion.

The fourth holes may be arranged in a zigzag form while partially overlapping each other along the lengthwise direction of the flexible region, wherein a length of each overlapped portion of the fourth holes is shorter than a length of each overlapped portion of the second holes.

In order to accomplish the fourth object of the present disclosure, a flexible display unit of the present disclosure may include a flexible display formed to be elastically deformed; and a flexible frame coupled to a rear surface of the flexible display, wherein the flexible frame includes a flexible portion in which first holes are repeatedly formed to be bendable up to a state having a maximum first curvature; and a rigid portion disposed on at least one side of the flexible portion, and the flexible frame is formed of a titanium material.

When the flexible display is deformed, an interval between the first holes may be enlarged or reduced to apply a restoring force to the flexible display.

An adhesive portion may be disposed between the flexible display and the flexible frame, and a part of the adhesive portion may be exposed rearward through the first holes.

In order to accomplish the fifth object of the present disclosure, the flexible display unit of the present disclosure may include an adhesive portion disposed on a rear surface of the flexible display; and a silicon portion disposed between the adhesive portion and the flexible frame, wherein the silicon portion includes a first portion disposed on the flexible portion and the rigid portion; and a second portion filled in the first holes.

The second portion may form the same plane as the rear surface of the flexible frame. The silicon portion may be integrally formed with the flexible frame by insert injection.

Alternatively, the flexible display unit of the present disclosure may further include an adhesive portion disposed between the flexible display and the flexible frame; and a silicon portion filled in the first holes.

The silicon portion may be brought into contact with a part of the adhesive portion exposed through the first holes.

The silicon portion may form the same plane as the rear surface of the flexible frame.

The silicon portion may be integrally formed with the flexible frame by insert injection.

On the other hand, the present disclosure may include a flexible display formed to be elastically deformed; and a flexible frame coupled to a rear surface of the flexible display, wherein the flexible frame includes a first flexible portion in which first holes are repeatedly formed to be bendable up to a state having a maximum first curvature; a second flexible portion in which second holes parallel to the first holes are repeatedly formed on one side of the first flexible portion, and configured to be bendable up to a state having a maximum second curvature; and a third flexible portion in which third holes parallel to the first holes are repeatedly formed on the other side of the first flexible portion, and configured to be bendable up to a state having a maximum third curvature; and wherein the first curvature is at least two times the second and third curvatures.

Moreover, the present disclosure discloses a mobile terminal, including a terminal body formed of an elastically deformable material, a flexible display unit coupled to one surface of the terminal body and configured to be elastically deformable together with the terminal body; and magnet portions provided at both ends of the terminal body disposed to face each other in a state where the first to third flexible portions are bent at the first to third curvatures, respectively, to exert attractive forces on each other.

The effects of the present disclosure obtained through the above-mentioned solution are as follows.

First, a total area occupied by the first holes per unit area in the first flexible portion is designed to be larger than a total area occupied by the second holes per unit area in the second flexible portion, thereby implementing a flexible frame that is bendable at a larger curvature in the first flexible portion than the second flexible portion. Therefore, the flexible frame may be laminated with a flexible display, thereby implementing a flexible display unit in which two adjacent portions are bent at different maximum curvatures.

Second, since a repulsive force to be restored increases as increasing a degree of bending, and a total area occupied by the holes per unit area in each flexible portion may be adjusted to adjust a degree of bending and a repulsive force of the flexible display unit.

Third, a connecting portion may be formed between two flexible portions that is bendable at different maximum curvatures or a boundary portion may be formed between a flexible portion and a rigid portion, thereby implementing a flexible display unit in which two adjacent portions having different curvatures are connected smoothly.

Fourth, when titanium having a lower yield strength compared to stainless steel but having a predetermined level of yield strength and a large yield strain is used for a flexible frame, the flexible display may be restored to a flat state all the time, thereby preventing the phenomenon of undulating like a wave. Therefore, the reliability of the flexible display unit can be improved.

Fifth, since a silicon portion may be provided between the flexible display and the flexible frame to elastically support the flexible display, thereby absorbing an impact transmitted to the flexible display at a predetermined level. Moreover, since the silicon portion is filled in the holes of the flexible frame, a restoring force of the silicon portion may be added to a restoring force of the flexible frame itself, thereby increasing a total restoring force.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 7 is a conceptual view for explaining an X direction arrangement form of holes applied to the first flexible portion shown in FIG. 5;

FIG. 22 is a conceptual view showing an example of a mobile terminal to which a flexible display unit having another example of the flexible frame of the present disclosure is applied.

DETAILED DESCRIPTION OF THE INVENTION

Hereinafter, a flexible frame according to the present invention and a flexible display unit having the same will be described in detail with reference to the drawings.

In describing the embodiments disclosed herein, moreover, the detailed description will be omitted when a specific description for publicly known technologies to which the invention pertains is judged to obscure the gist of the present invention.

The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

In the following description, a singular representation may include a plural representation as far as it represents a definitely different meaning from the context.

Figure 1:
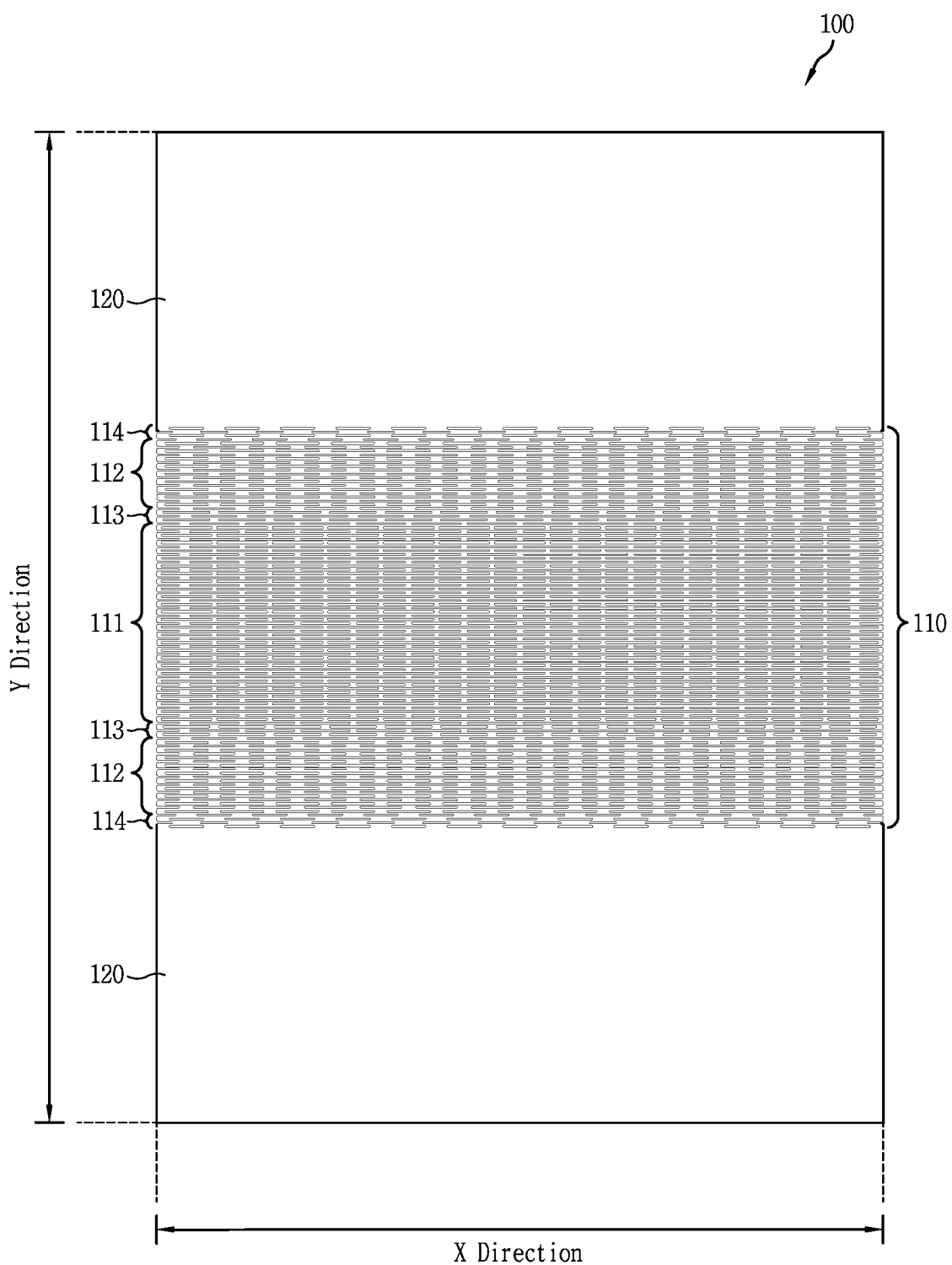
FIG. 1 is a view showing an example of a flexible frame of the present disclosure.
Figure 2:
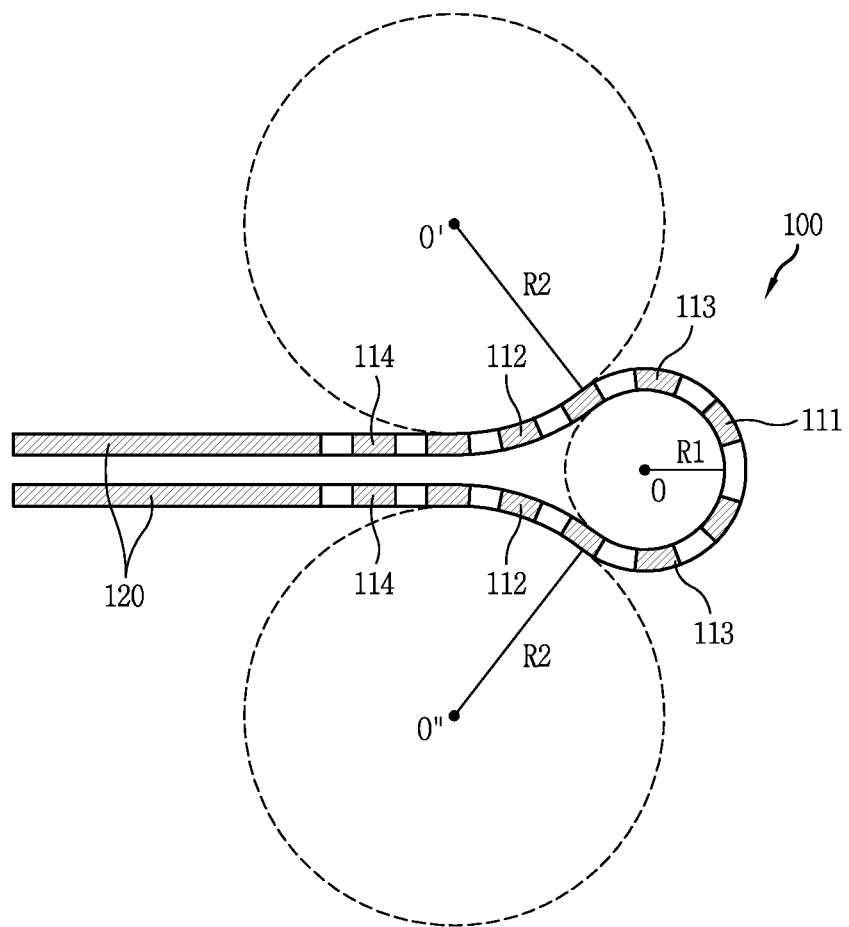
FIG. 2 is a conceptual view showing a state in which each flexible portion of the flexible frame shown in FIG. 1 is bent at a maximum curvature.
Figure 3:
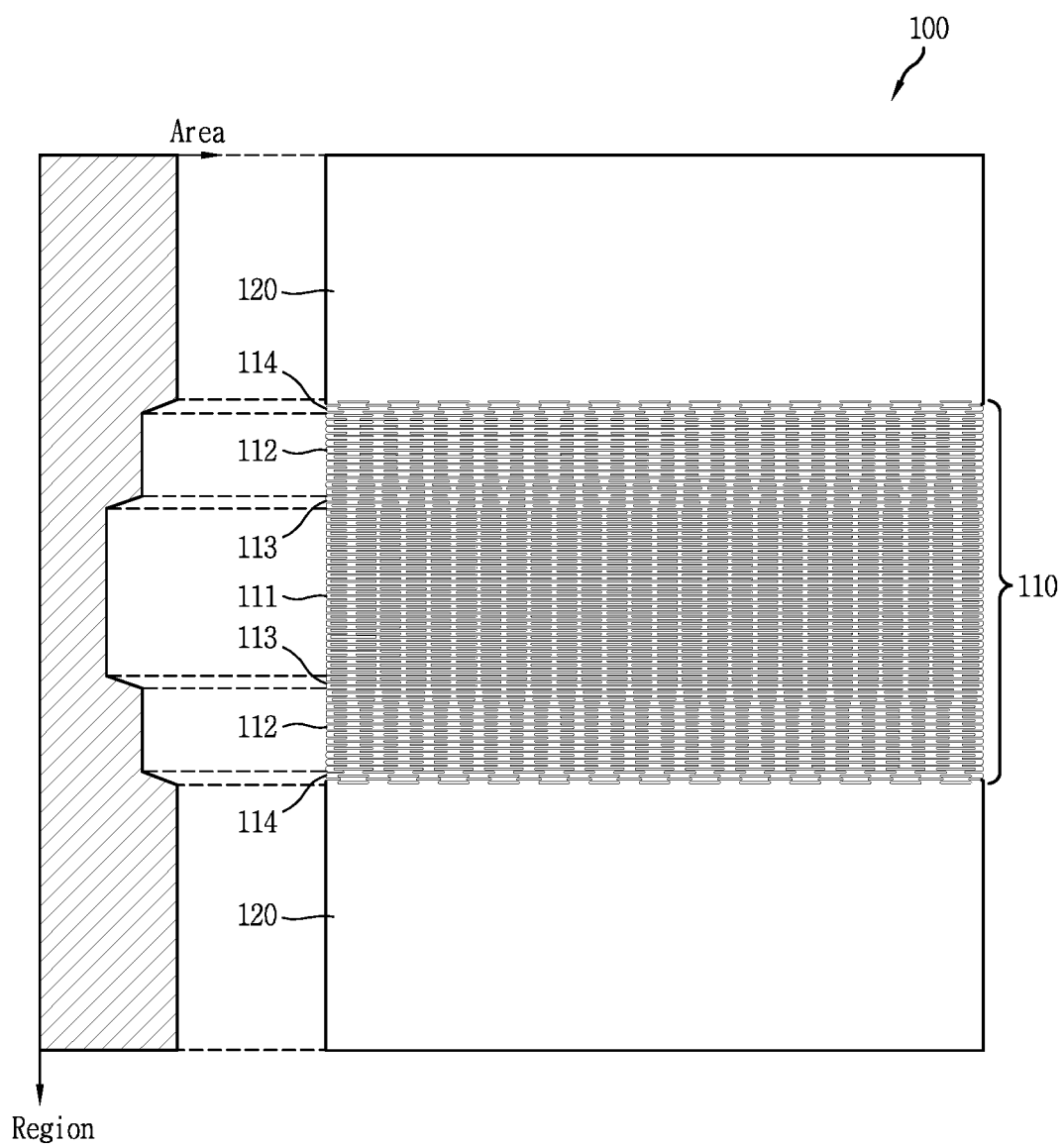
FIG. 3 is a conceptual view showing a Y direction area change of the flexible frame shown in FIG. 1.
Figure 4:
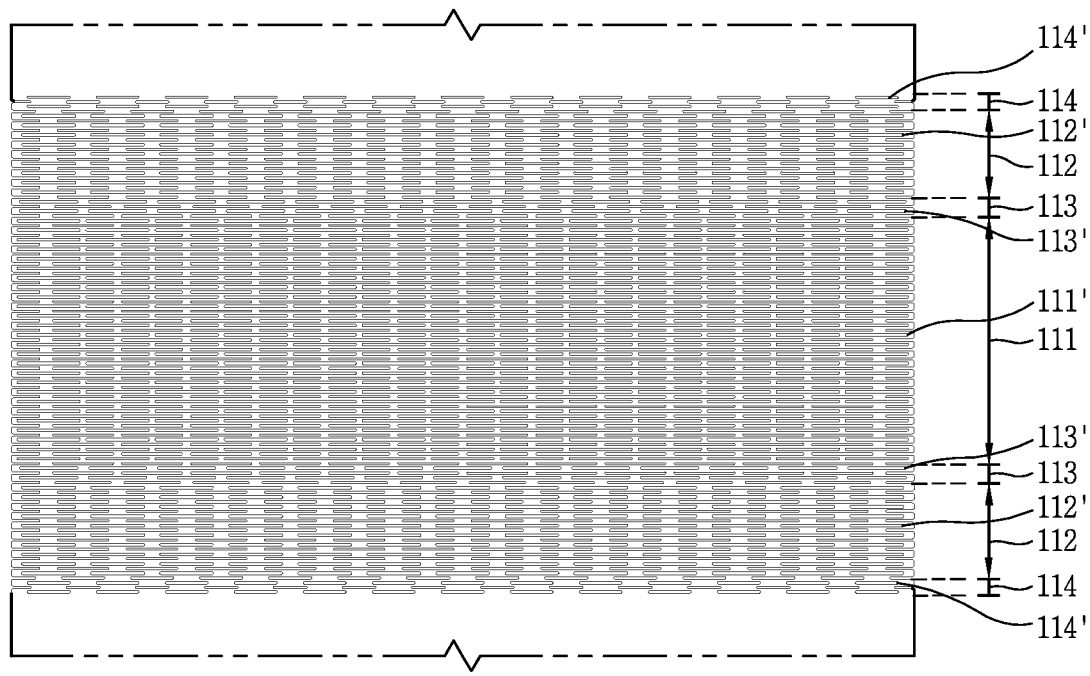
FIG. 4 is an enlarged view of a flexible region shown in FIG. 1.

FIG. 1 is a view showing an example of a flexible frame 100 of the present disclosure, and FIG. 2 is a conceptual view showing a state in which each flexible portion of the flexible frame 100 shown in FIG. 1 is bent at a maximum curvature, and FIG. 3 is a conceptual view showing a Y direction area change of the flexible frame 100 shown in FIG. 1, and FIG. 4 is an enlarged view of a flexible region 110 shown in FIG. 1.

In the following description, the X direction corresponds to a widthwise direction of the flexible frame 100, and the Y direction corresponds to a lengthwise direction of the flexible frame 100.

Referring to FIGS. 1 to 4, the flexible frame 100 includes the flexible region 110 that is bendable at least at a maximum curvature. The flexible region 110 may include flexible portions that is bendable at different maximum curvatures. The flexible portions may be sequentially disposed along one direction (Y direction in the drawing) of the flexible frame 100, so that the flexible frame 100 can be bent with respect to one direction.

In this example, the flexible region 110 includes a first flexible portion 111 that is bendable up to a state having a maximum first curvature and a second flexible portion 112 that is bendable up to a state having a maximum second curvature. As shown in the drawing, two second flexible portions 112 may be provided, and disposed on both sides of the first flexible portion 111 in the Y direction.

First holes 111' are repeatedly formed on the first flexible portion 111 to implement the bending of the first flexible portion 111. In other words, flexibility may be generated on the first flexible portion 111 due to the first holes 111', and the first flexible portion 111 may be bent up to a state having the maximum first curvature.

The first holes 111' are repeatedly formed along the X and Y directions intersecting each other. The first holes 111' are elongated in the X direction.

Similarly, second holes 112' are repeatedly formed on the second flexible portion 112 to implement the bending of the second flexible portion 112. In other words, flexibility may be generated on the first flexible portion 112 due to the first holes 112', and the first flexible portion 112 may be bent up to a state having the maximum first curvature. Here, the second curvature has a curvature different from the first curvature.

The second holes 112' are formed parallel to the first holes 111' so that the second flexible portion 112 can be bent with respect to the Y direction together with the first flexible portion 111. The second holes 112' are respectively formed in a repetitive manner along the X and Y directions intersecting each other. The second holes 112' are extended in an elongated manner in the X direction.

In this example, the first curvature is greater than the second curvature. In other words, the first flexible portion 111 is configured to be more bendable than the second flexible portion 112. Therefore, while the first and second flexible portions 111, 112 are bent at the first and second curvatures, respectively, a repulsive force acting on the first flexible portion 111 is greater than that acting on the second flexible portion 112.

In FIG. 2, it is shown that the first and second flexible portions 111, 112 are bent to the maximum. Since the reciprocal of the curvature is a curvature radius, a curvature radius (R1) of the first flexible portion 111 is smaller than a curvature radius (R2) of the second flexible portion 112 in this state. The center (O) of the curvature radius (R1) of the first flexible portion 111 is located in an inner space formed by the folding of the flexible frame 100, and the center (O', O") of the curvature radius of the second flexible portion 112 is located in an outer space formed by the folding of the flexible frame 100.

A rigid portion 120 is disposed on one side of each second flexible portion 112 in the Y direction. The rigid portion 120, as a portion that is hardly bent by an external force, may be formed in a plane. The rigid portion 120 is not formed with holes intended to implement bending.

As described above, the rigid portion 120 and the first flexible portion 111 are disposed on both sides of the second flexible portion 112 in the Y direction. In a state where the first and second flexible portions 111, 112 are bent to the maximum, the rigid portions 120 are arranged to face each other.

Referring to FIG. 3, the larger a total area occupied by the holes per unit area of the flexible portion, the more flexible the flexible portion becomes. In other words, the smaller a total area occupied by an inherently rigid material per unit area of the flexible portion, the more flexible the flexible portion becomes. It means that a maximum curvature of the flexible portion can be adjusted by changing a total area occupied by the holes per unit area of the flexible portion at design time.

In this manner, a total area occupied by the first holes 111' per unit area in the first flexible portion 111 is greater than a total area occupied by the second flexible portions 111 per unit area in the second flexible portion 111 so that the first flexible portion 111 is more bendable than the second flexible portion 112.

As described above, the second flexible portion 112 is disposed on both sides of the first flexible portion 111, respectively, in the Y direction, and the rigid portion 120 is provided on one side of each second flexible portion 112 in the Y direction.

A connecting portion 113 for smoothly connecting the first flexible portion 111 and the second flexible portion 112 is formed between the first flexible portion 111 and the second flexible portion 112. Similarly, a boundary portion 114 for smoothly connecting the first flexible portion 112 and the second flexible portion 120 is formed between them.

In other words, the rigid portion 120, the boundary portion 114, the second flexible portion 112, the connecting portion 113, the first flexible portion 111, the connecting portion 113, the second flexible portion 112, the boundary portion 114, and the rigid portion 120 are sequentially arranged on the flexible frame 100.

Hereinafter, each of the portions will be described in more detail.

For reference, only the first flexible portion 111 and the second flexible portion 112 are formed in such a manner that a total area occupied by the first holes 111' per unit area is larger than a total area occupied by the second holes 112', but there is substantially no difference in the arrangement of the first hole 111' and the second hole 112'. Therefore, the description of the first flexible portion 111 with reference to FIGS. 5 to 8 below may be applied as it is to the second flexible portion 112 as it is.

Figure 5:
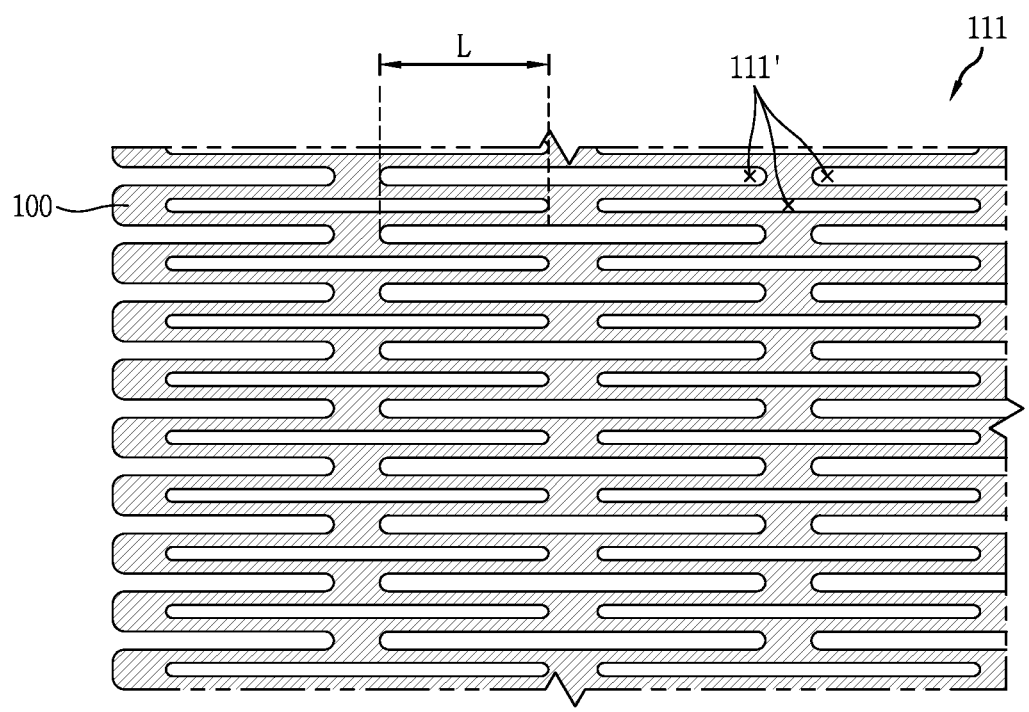
FIG. 5 is an enlarged view of a first flexible portion shown in FIG. 4.

FIG. 5 is an enlarged view of the first flexible portion 111 shown in FIG. 4.

Referring to FIG. 5, the first holes 111' formed in the first flexible portion 111 are repeatedly formed along the X and Y directions intersecting each other. The first holes 111' formed in the first flexible portion 111 are formed in an elongated manner in the X direction so that the first flexible portion 111 is bendable with respect to the Y direction.

The first holes 111' may be formed in a recessed shape at both end portions of the flexible frame 100 in the X direction. The first holes 111' having such a shape may be formed one by one along the Y direction.

The first holes 111' are arranged in a zigzag manner while partially overlapping each other along the Y direction. As shown in the drawing, the first holes 111' arranged along the X direction are disposed directly in the Y direction above or below a region between the first holes 111' arranged along the X direction (a region where an inherent material of the rigid flexible frame 100 remains, hereinafter referred to as a "link").

As described above, the second holes 112' having the same shape as the first holes 111' formed on the first flexible portion 111 may be also formed on the the second flexible portion 112. However, a length of a mutually overlapping portion between the second holes 112' is designed to be shorter than that of a mutually overlapping portion between the first holes 111'.

A repulsive force per unit area of the link may be calculated by the following equation.

$$T = \frac{\theta G J'}{l}$$

T=Repulsive force (Torque) (Nm)
l=Length (m) where holes are overlapped along the Y direction
G=Modulus of rigidity (N/m2)

J'=Polar moment of inertia (m4)
θ=Bent angle per link (radians)

$$\theta = \frac{\Theta(\text{Total})}{n}$$

n=Number of links formed along the Y direction
Θ(Total)=Angle bent to the maximum (radians)

In other words, as an overlapping length of the holes increases along the Y direction, a repulsive force decreases, and as a bent angle of per link increases, a repulsive force increases.

As a result of the simulation, a bent angle per link in the first flexible portion 111 is overwhelmingly larger than a bent angle per link in the second flexible portion 112 (approximately 20 times), and thus it can be seen that a larger repulsive force acts on the first flexible portion 111 though a length where the holes are overlapped along the Y direction is shorter in the first flexible portion 111.

On the other hand, since the links are arranged along the X direction, the repulsive force increases in proportion to a number of the arranged links. In this example, since the number of links arranged in the X direction is the same for both the first flexible portion 111 and the second flexible portion 112, it can be seen that there is no great influence on the mutual comparison of the repulsive forces is.

Figure 6:
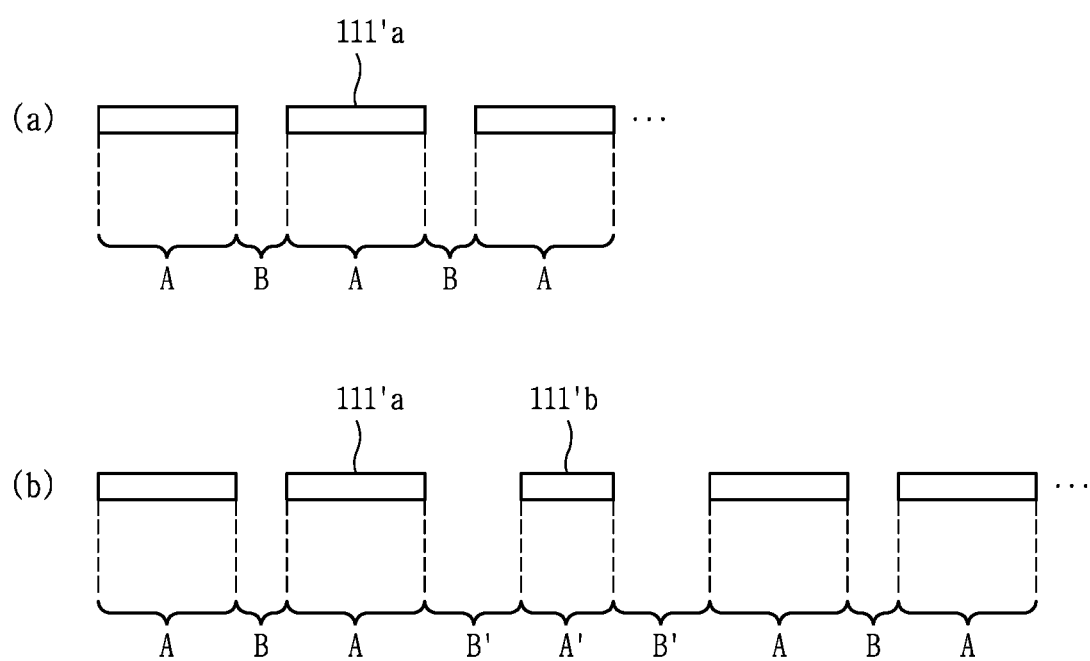
FIG. 6 is a conceptual view for explaining an X direction arrangement form of holes applied to the first flexible portion shown in FIG. 5.

FIG. 6 is a conceptual view for explaining the X direction arrangement of the first holes 111' applied to the first flexible portion 111 shown in FIG. 5.

Referring to FIG. 6A, the first holes 111' may include a plurality of holes 111'a arranged at preset intervals along the X direction while having the same width (X direction).

As shown in the drawing, each of the plurality of holes 111'a may have a width (A) and may be spaced apart from each other with a spacing interval (B) therebetween. As described above, the plurality of holes 111'a may have a repeated shape according to a constant reference (width and spacing interval).

In some embodiments, the flexible portions may include perforations to allow for bending of the frame which do not correspond to fully defined holes or openings. For example, a perforation may correspond to a puncture in a particular pattern where the material of the flexible frame is punctured or cut to allow for flexing of the frame at the puncture or cut location. The perforation may not correspond to any material removed from the frame, and the material of the frame may be left attached where the puncture or cut is located. Other embodiments may include a combination of an opening or a hole where material of the frame is actually removed (or formed to not include such portions) along with a perforation or cut of the material adjacent to the opening or hole. In other embodiments, an opening or hole may have a concave portion, where the material of the frame juts into the opening or hole area to define a "dent" in the opening or hole. It will be appreciated that all of these various embodiments are considered in this disclosure and may be combinable with any other configuration discussed herein.

Referring to FIG. 6B, the first holes 111' may further include a hole 111'b that is different in at least one of width and spacing interval from the plurality of holes 111'a.

As shown in the drawing, at least one hole 111'b that is different in at least one of width and spacing from the plurality of holes 111'a may be added between the plurality of holes 111'a having a width (A) and being spaced apart from each other with a spacing interval (B) therebetween.

The added hole 111'b has a width (A'), and the width (A') has a value smaller or larger than the width (A). Furthermore, a spacing interval (B') between the added hole 111'b and one of the plurality of holes 111'a repeatedly disposed adjacent thereto according to a predetermined reference has a value smaller or larger than the spacing distance (B).

In this drawing, it is seen that a hole 111'b having a left-right spacing interval (B') and a width (A') is added between a plurality of holes 111'a repeatedly arranged according to a predetermined reference. The left and right spacing intervals may be of course set differently from each other.

By adding the holes described above, the maximum curvature or repulsive force of the first flexible portion 111 may be adjusted. For example, when the spacing interval (B') is increased beyond the spacing interval (B) or the width (A') is reduced from the width (A), the maximum curvature of the first flexible portion 111 may be reduced, and accordingly the repulsive force acting thereon may be reduced. On the contrary, when the spacing interval (B') is reduced from the spacing interval (B) or the width (A') is increased beyond the width (A), the maximum curvature of the first flexible portion 111 may be increased, and accordingly the repulsive force acting thereon may be increased.

FIG. 7 is a conceptual view for explaining the Y direction arrangement of the first holes 111' applied to the first flexible portion 111 shown in FIG. 5.

Referring to FIG. 7A, the first holes 111' may include a plurality of holes 111'c arranged at preset intervals along the Y direction while having the same length (Y direction).

As shown in the drawing, each of the plurality of holes 111'c may have a length (C) and may be spaced apart from each other with a spacing interval (D) therebetween. As described above, the plurality of holes 111'c may have a repeated shape according to a constant reference (length and spacing interval).

Referring to FIG. 7B, the first holes 111' may further include a hole 111'd that is different in at least one of length and spacing interval from the plurality of holes 111'c.

As shown in the drawing, a hole 111'd that is different in at least one of length and spacing interval from the plurality of holes 111'c may be added between the plurality of holes 111'c having a length (C) and being spaced apart from each other with a spacing interval (D) therebetween. The added hole 111'd has a length (C') and the length C' has a value smaller or larger than the length (C). Furthermore, a spacing interval (D') between the added hole 111'd and one of the plurality of holes 111'c repeatedly disposed adjacent thereto according to a predetermined reference has a value smaller or larger than the spacing distance (D).

In this drawing, it is seen that a hole 111'd having a left-right spacing interval (D') and a length (C') is added between a plurality of holes 111'c repeatedly arranged according to a predetermined reference. The left and right spacing intervals may be of course set differently from each other.

By adding the holes described above, the maximum curvature or repulsive force acting on the first flexible portion 111 may be adjusted. For example, when the spacing interval (D') is increased beyond the spacing interval (D) or the length (C') is reduced from the length (C), the maximum curvature of the first flexible portion 111 may be reduced, and accordingly the repulsive force acting thereon may be reduced. On the contrary, when the spacing interval (D') is reduced from the spacing interval (D) or the length (C') is increased beyond the length (C), the maximum curvature of the first flexible portion 111 may be increased, and accordingly the repulsive force acting thereon may be increased.

In summary, the first and second holes 111', 112' include a plurality of holes arranged at the same size and at predetermined intervals. Here, the same size denotes that the width (X direction) and the length (Y direction) are the same. In some cases, a hole that is to different in at least one of size or spacing interval from the plurality of holes may be added between the plurality of holes.

Figure 8:
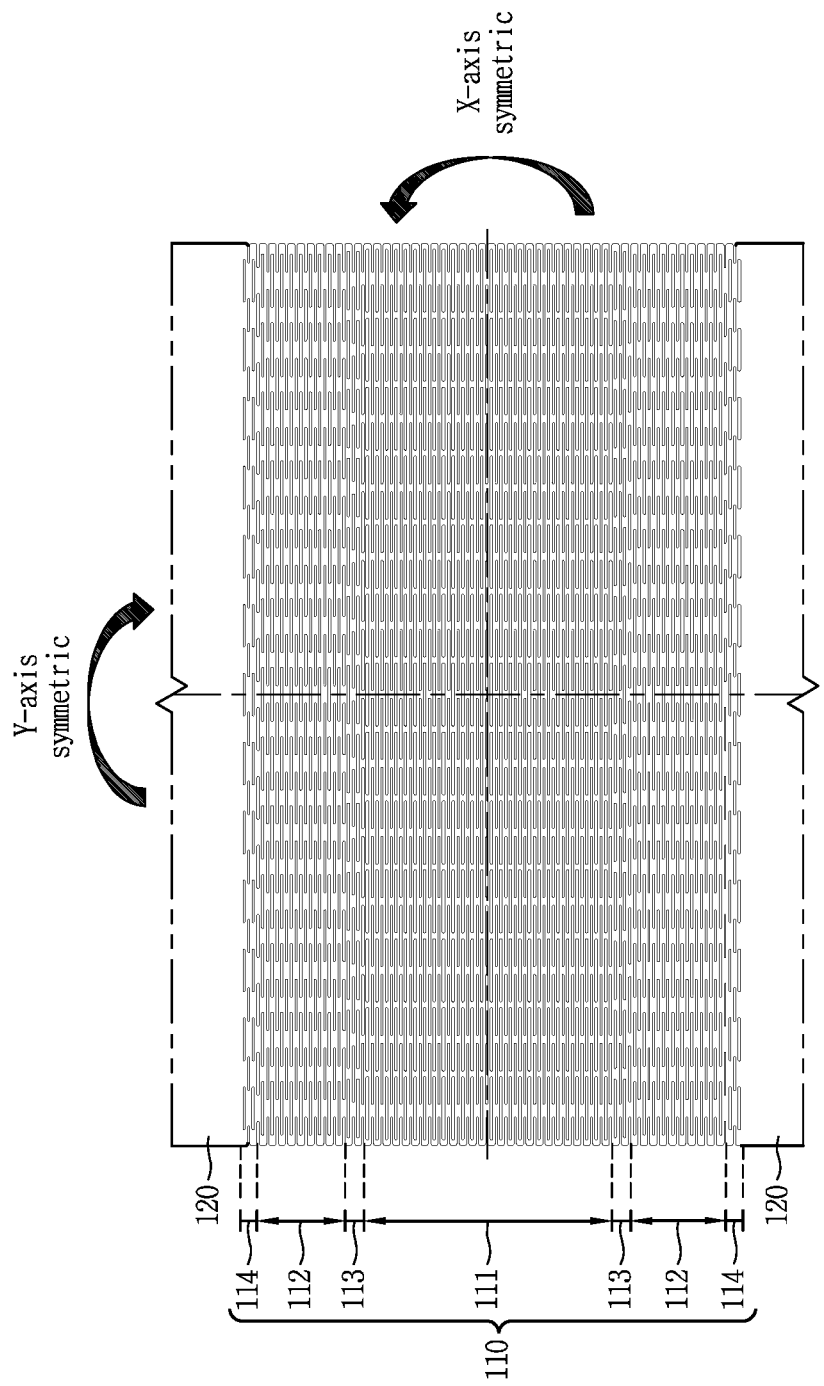
FIG. 8 is a conceptual view for explaining that the first flexible portion shown in FIG. 5 can have a symmetrical shape with respect to the X and Y axes.

FIG. 8 is a conceptual view for explaining that the first flexible portion shown in FIG. 5 can have a symmetrical shape with respect to the X and Y axes.

Referring to FIG. 8, the first flexible portion 111 may have a symmetrical shape with respect to an axis (X-axis) in the X direction passing through the center. Accordingly, in a state where the first flexible portion 111 is bent with respect to the Y direction, the first flexible portion 111 may have a symmetrical shape about the X-axis.

Similarly, the first flexible portion 111 may have a symmetrical shape with respect to an axis (Y-axis) in the Y direction passing through the center. Accordingly, in a state where the first flexible portion 111 is bent with respect to the Y direction, the first flexible portion 111 may maintain a uniform shape in the X direction.

When the first flexible portion 111 and the second flexible portion 112 are formed successively as the first flexible portion 111 and the second flexible portion 112 are configured to be bendable at different maximum curvatures, the flexible frame 100 may be damaged due to a change of curvature at the boundary. Hereinafter, a structure in which adjacent first and second flexible portions 111, 112 having different curvatures can be smoothly connected will be described.

Figure 9:
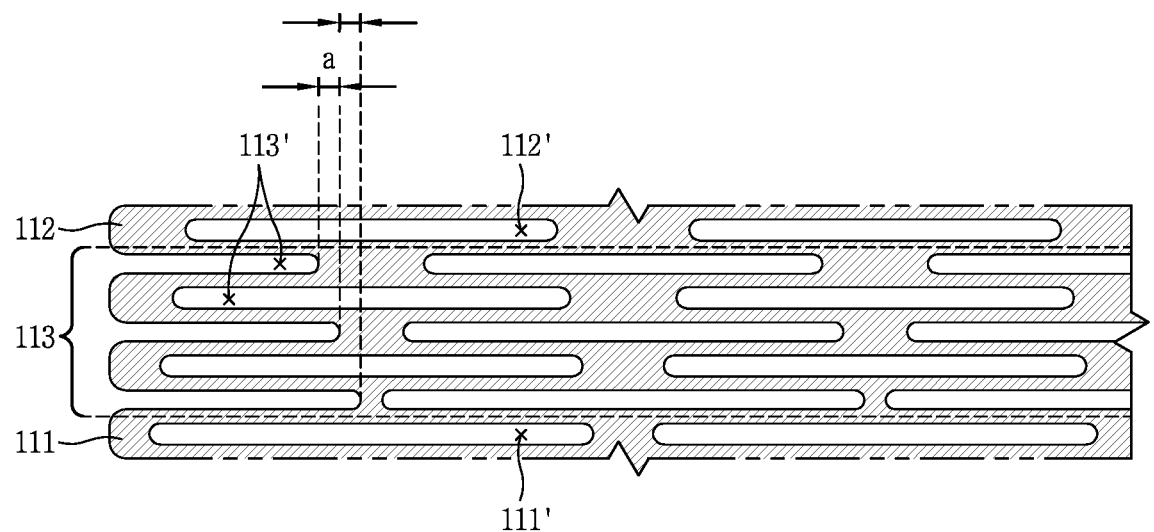
FIG. 9 is an enlarged view of a connecting portion shown in FIG. 4.

FIG. 9 is an enlarged view of a connecting portion 113 shown in FIG. 4.

Referring to FIG. 9, the connecting portion 113 for smoothly connecting the first flexible portion 111 and the second flexible portion 112 is formed between the first flexible portion 111 and the second flexible portion 112. Third holes 113' parallel to the first and second holes 111', 112' are repeatedly formed on the connecting portion 113 so that the connecting portion 113 can be bent in the Y direction. The first holes 113' are formed in an elongated manner in the X direction.

A degree of bending of the connecting portion 113 may be adjusted by changing a total area occupied by the third holes 113' per unit area of the connecting portion 113 as described above with respect to the first and second flexible portions 111, 112.

The connecting portion 113 is configured to be less bendable than the first flexible portion 111 and more bendable than the second flexible portion 112. To this end, a total area occupied by the third holes 113' per unit area in the connecting portion 113 is set to be smaller than a total area occupied by the first holes 111' per unit area in the first flexible portion 111, and larger than a total area occupied by the second holes 112' per unit area in the flexible portion 112.

For this purpose, a length of each of the third holes 113' may be set to be smaller than that of the first holes 111' and greater than that of the second holes 112'. Alternatively, a spacing interval between the third holes 113' may be set to be larger than that between the first holes 111' and smaller than that between the second holes 112'.

The third holes 113' are arranged in a zigzag manner while partially overlapping each other along the Y direction. As shown in the drawing, the third holes 113' arranged along the X direction are disposed in the Y direction directly above or below a region between the third holes 113' arranged along the X direction (a region where an inherent material of the rigid flexible frame 100 remains).

Here, a length of a mutually overlapping portion between the third holes 113' along the Y direction is set to be smaller than that of a mutually overlapping portion between the first holes 111' and larger than that of a mutually overlapping portion between the second holes 112'.

The connecting portion 113 may be configured such that a degree of bending gradually decreases from the first flexible portion 111 to the second flexible portion 112. In this case, a maximum curvature at one end portion of the connecting portion 113 adjacent to the first flexible portion 111 may be set to be larger than that at the other end portion of the connecting portion 113 adjacent to the second flexible portion 112. In other words, the maximum curvature at one end portion of the connecting portion 113 may be set to be smaller than the first curvature, and the maximum curvature at the other end portion of the connecting portion 113 may be set to be larger than the second curvature.

For this purpose, a length of each of the third holes 113' may be set to gradually decrease from the first flexible portion 111 to the second flexible portion 112. Here, a degree of reduction of the length of the third holes 113' may have a constant value (a). Alternatively, an interval spaced between the third holes 113' may be set to gradually increase from the first flexible portion 111 to the second flexible portion 112. Here, a degree of increase in the spacing interval between the third holes 113' may have a constant value.

Moreover, a length of a mutually overlapping portion between the third holes 113' may be set to gradually decrease from the first flexible portion 111 to the second flexible portion 112 in the Y direction.

Similarly to the connecting portion 113 for smoothly connecting the first flexible portion 111 and the second flexible portion 112, a boundary portion 114 is provided even between the second flexible portion 112 and the rigid portion 120. Hereinafter, a structure in which adjacent second flexible portion 112 and rigid portion 120 having different curvatures can be smoothly connected will be described.

Figure 10:
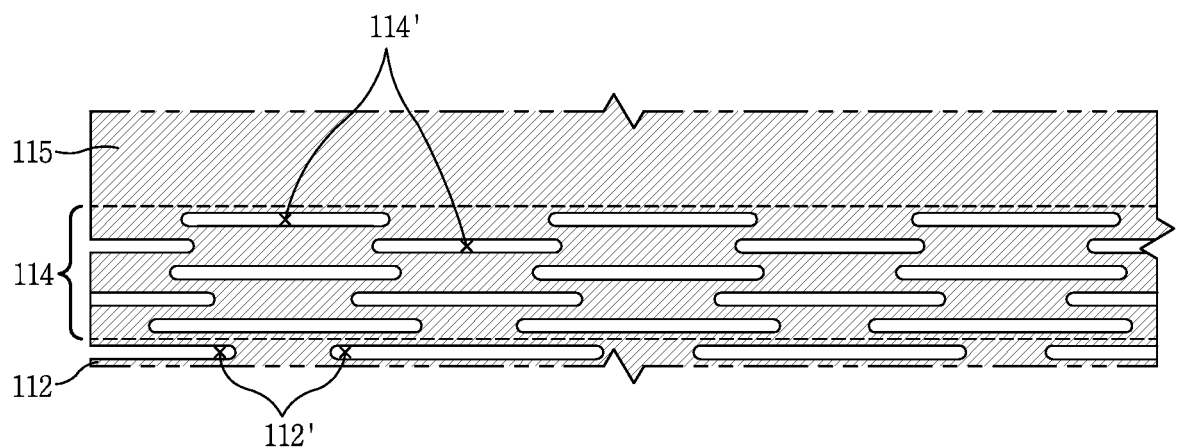
FIG. 10 is a conceptual view showing an example of a boundary portion shown in FIG. 4.

FIG. 10 is a conceptual view showing an example of the boundary portion 114 shown in FIG. 4.

Referring to FIG. 10, the connecting portion 114 for smoothly connecting the second flexible portion 112 and the rigid portion 120 is formed between them. The fourth holes 114' are repeatedly formed on the boundary portion 114 so that the boundary portion 114 can be bent in the Y direction. The fourth holes 114' may be extended in an elongated manner in the X direction and disposed in parallel with the second holes 112'.

A degree of bending of the boundary portion 114 may be adjusted by changing a total area occupied by the fourth holes 114' per unit area of the boundary portion 114 as described above with respect to the connecting portion 113.

The boundary portion 114 is configured to be less bendable than second flexible portion 112. For this purpose, a total area occupied by the fourth holes 114' per unit area in the boundary portion 114 is set to be smaller than a total area occupied by the second holes 112' per unit area in the second flexible portion 112.

For this purpose, a length of each of the fourth holes 114' may be set to be smaller than that of the second holes 112'.

Alternatively, a spacing interval between the fourth holes 114' may be set to be larger than that between the second holes 112'.

The fourth holes 114' may be arranged in a zigzag manner while partially overlapping each other along the Y direction. As shown in the drawing, the fourth holes 114' arranged along the X direction are disposed in the Y direction directly above or below a region between the fourth holes 114' arranged along the X direction (a region where an inherent material of the rigid flexible frame 100 remains).

Here, a length of a mutually overlapping portion between the fourth holes 114' along the Y direction is set to be smaller than that of a mutually overlapping portion of the second holes 112'.

A maximum curvature at one end portion of the boundary portion 114 adjacent to the second flexible portion 112 may be set to be larger than that at the other end portion of the boundary portion 114 adjacent to the rigid portion 120. In other words, the maximum curvature at one end portion of the boundary portion 114 may be set to be smaller than the second curvature, and the maximum curvature at the other end portion of the boundary portion 114 may be set to be larger than zero.

For this purpose, a length of a hole adjacent to the second flexible portion 112 among the fourth holes 114' may be set to be larger than that of a hole adjacent to the rigid portion 120. Alternatively, a spacing interval between the fourth holes 114' in a portion adjacent to the second flexible portion 112 may be set to be smaller than that between the fourth holes 114' in a portion adjacent to the rigid portion 120.

Figure 11:
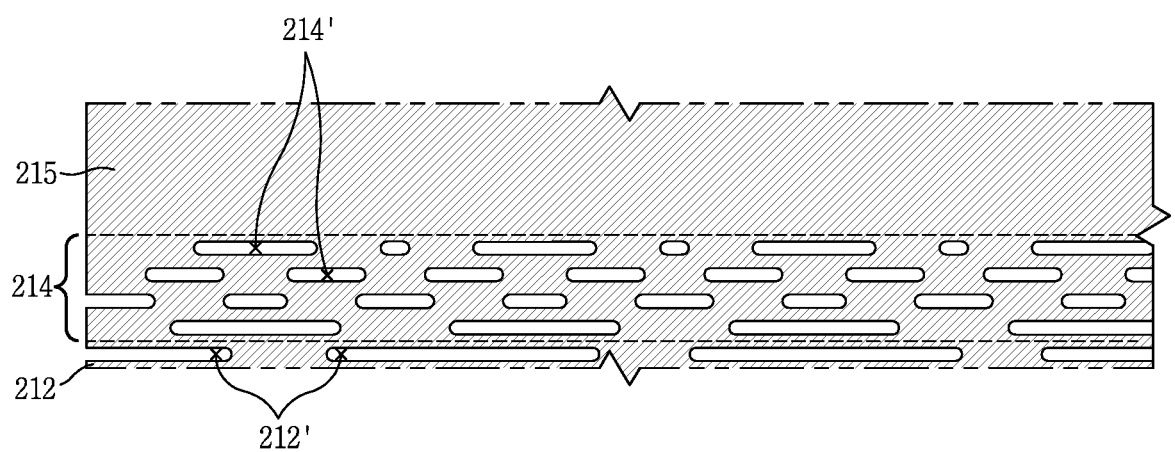
FIG. 11 is a conceptual view showing another example of a boundary portion shown in FIG. 4.

FIG. 11 is a conceptual view showing another example of the boundary portion 114 shown in FIG. 4.

Referring to FIG. 11, similarly to the previous example, the fourth holes 214' are repeatedly formed on the boundary portion 214 so that the boundary portion 214 can be bent in the Y direction. The fourth holes 214' may be extended in an elongated manner in the X direction and disposed in parallel with the second holes 212'.

The boundary portion 214 is configured to be less bendable than second flexible portion 212. For this purpose, a total area occupied by the fourth holes 214' per unit area in the boundary portion 214 is set to be smaller than a total area occupied by the second holes 212' per unit area in the second flexible portion 212.

However, the fourth holes 214' for implementing this may be randomly arranged. In other words, the fourth holes 214' may be randomly arranged under the condition that a total area occupied by the fourth holes 214' per unit area in the boundary section 214 is set to be smaller than a total area occupied by the second holes 212' per unit area in the second flexible portion 212.

A maximum curvature at one end portion of the boundary portion 214 adjacent to the second flexible portion 212 may be set to be larger than that at the other end portion of the boundary portion 214 adjacent to the rigid portion 220. In other words, the maximum curvature at one end portion of the boundary portion 214 may be set to be smaller than the second curvature, and the maximum curvature at the other end portion of the boundary portion 214 may be set to be larger than zero.

For this purpose, a total area occupied by the fourth holes 214' per unit area at one end portion of the boundary portion 214 adjacent to the second flexible portion 212 may be set to be greater than a total area occupied by the fourth holes 214' per unit area at the other end portion of the boundary portion 214 adjacent to the rigid portion 220. In other words, a degree of bending of the boundary portion 214 may be adjusted in such a manner that a total area occupied by an inherent rigid material per unit area of the boundary portion 214 is greater at one end portion than at the other end portion of the boundary portion 214.

Figure 12:
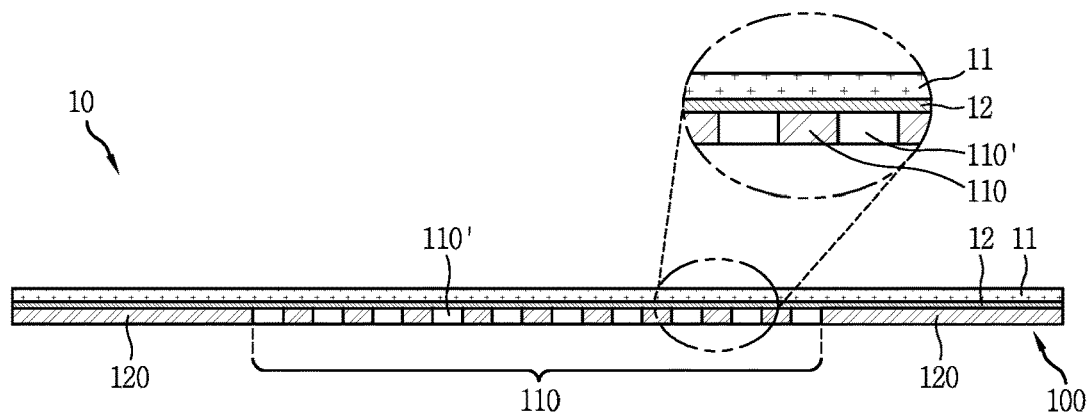
FIG. 12 is a conceptual view showing an example of a flexible display unit having a flexible frame according to the present disclosure.

FIG. 12 is a conceptual view showing an example of a flexible display unit 10 having the flexible frame 100 of the present disclosure.

Referring to FIG. 12, the flexible display unit 10 is formed in an elastically deformable manner, and includes a flexible display 11 and the foregoing flexible frame 100.

The flexible display 11 is formed to be elastically deformable by an external force. The flexible display 11 may be configured to allow a touch input.

The flexible frame 100 is coupled to a rear surface of the flexible display 11. The flexible display 11 is disposed to cover the rigid portion 120 and the flexible region 110 of the flexible frame 100. Therefore, when the flexible region 110 is bent, the flexible display 11 is also bent, and when the flexible region 110 is restored, the flexible display 11 is also restored.

At least one or more flexible portions may be provided in the flexible region 110. When a plurality of flexible portions are provided, they may be configured to be bendable up to a state having different maximum curvatures.

Various laminated structures may be applied to the flexible display 11 and the flexible frame 100. For example, as shown in FIG. 12, the flexible display 11 and the flexible frame 100 may be coupled by a bonding portion 12 interposed therebetween. For the bonding portion 12, an OCA (optically clear adhesive) may be used. In the above structure, a part of the bonding portion 12 is exposed through holes formed on the flexible portion in a rearward direction, that is, onto a rear surface of the flexible frame 100.

According to the above structure, it is advantageous in that a laminated structure of the flexible display 11 and the flexible frame 100 may be implemented at a low cost, and a thickness of the flexible display unit 10 can be made slim.

Figure 13:
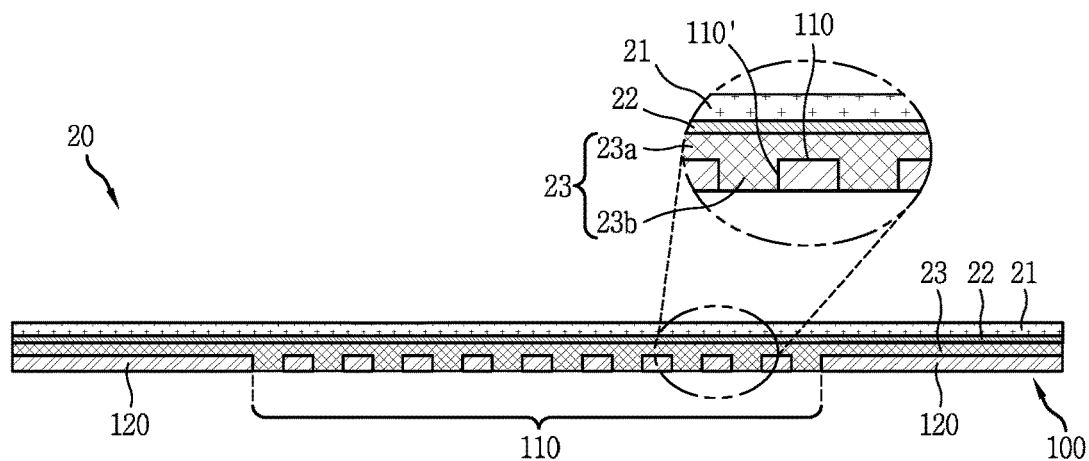
FIG. 13 is a conceptual view showing another example of a flexible display unit having a flexible frame according to the present disclosure.

FIG. 13 is a conceptual view showing another example of a flexible display unit 20 having the flexible frame 100 of the present disclosure.

Referring to FIG. 13, a bonding portion 22 is attached to a rear surface of the flexible display 21. For the bonding portion 22, an OCA (optically clear adhesive) may be used.

Between the bonding portion 22 and the flexible frame 100, a silicon portion 23 with an elastically deformable material is disposed. The silicon portion 23 includes a first portion 23a disposed on the flexible region 110 and the rigid portion 120 and a second portion 23b filled between the holes 110'. Here, the first portion 23a and the second portion 23b are integrally formed.

The first portion 23a of the silicon portion 23 is provided between the flexible display 21 and the flexible frame 100 to elastically support the flexible display 21. Therefore, an impact transmitted to the flexible display 21 may be absorbed to a determined level by the first portion 23a.

The second portion 23b is exposed through the holes 110' of the flexible region 110 in a rearward region, that is, onto a rear surface of the flexible frame 100. As shown in the drawing, the second portion 23b may form the same plane as the rear surface of the flexible frame 100.

The silicon portion 23 may be integrally formed with the flexible frame 100 by insert injection. The silicon part 23 is formed integrally with the flexible frame 100, thereby allowing the silicon portion 23 to increase a restoring force of the flexible frame 100 itself. In other words, in this laminated structure, a restoring force of the flexible portion 100 acts on a restoring force of the silicon portion 23 at the same time.

Therefore, this laminated structure has a larger restoring force compared to the laminated structure shown in FIG. 12.

In addition, the silicon portion 23 is configured to prevent the flexible frame 100 from being deformed by repeated bending. Therefore, according to this laminated structure, the reliability of the flexible frame 100 may be improved.

Figure 14:
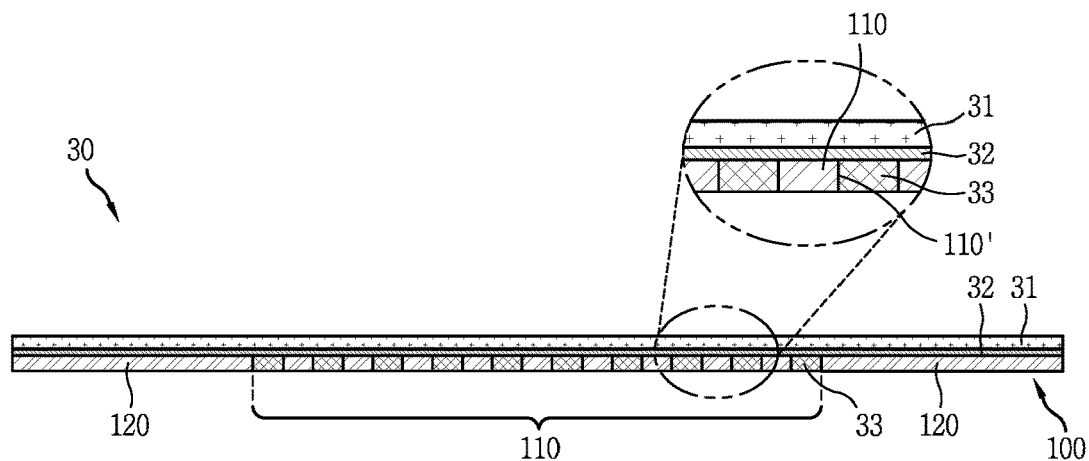
FIG. 14 is a conceptual view showing still another example of a flexible display unit having a flexible frame according to the present disclosure.

FIG. 14 is a conceptual view showing still another example of a flexible display unit 30 having the flexible frame 100 of the present disclosure.

Referring to FIG. 14, the flexible display 31 and the flexible frame 100 may be coupled by a bonding portion 32 interposed therebetween. For the bonding portion 32, an OCA (optically clear adhesive) may be used.

The holes 110' of the flexible region 110 are filled with a silicon portion 33 with an elastically deformable material. As shown in the drawing, the silicon portion 33 may be bought into contact with a portion of the bonding portion 32 exposed through the holes 110'. The silicon portion 33 may form the same plane as the rear surface of the flexible frame 100.

The silicon portion 33 may be integrally formed with the flexible frame 100 by insert injection. In other words, the silicon portion 33 may be filled between the holes 110'.

The silicon part 33 is formed integrally with the flexible frame 100, thereby allowing the silicon portion 33 to increase a restoring force of the flexible frame 100 itself. In other words, in this laminated structure, a restoring force of the flexible portion 100 acts on a restoring force of the silicon portion 33 at the same time. Therefore, this laminated structure has a larger restoring force compared to the laminated structure shown in FIG. 12.

Moreover, this laminated structure has an advantage capable of reducing a thickness of the silicon portion (the first portion 23a in FIG. 13) disposed on the flexible region 110 and the rigid portion 120. Therefore, when the present flexible display unit 30 is designed to have the same height as that of the flexible display unit 20 shown in FIG. 13, a thickness of the flexible frame 100 may be made thicker. Therefore, the present laminated structure has an advantage in that a yield strain of the flexible frame 100 compared to the laminated structure shown in FIG. 13 can be increased.

For reference, the laminated structures illustrated in FIGS. 12 to 14 may be applicable not only to the flexible frame 100 shown in FIG. 1 but also to various modified examples of the flexible frame. For example, the present laminated structures may be applicable to a flexible frame 400 (refer to FIG. 18) which will be described later.

Figure 15:
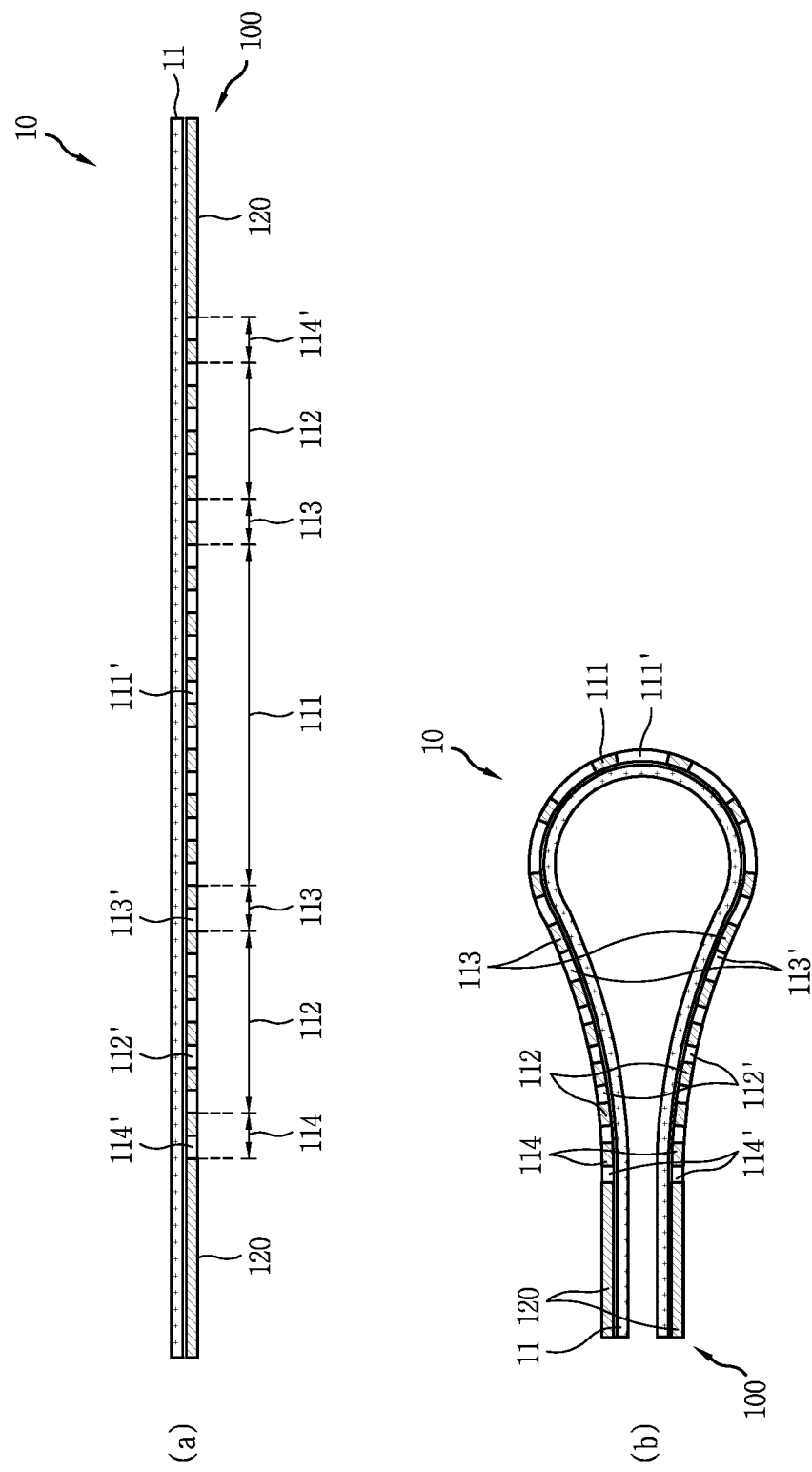
FIG. 15 is a conceptual diagram for explaining a restoring mechanism of a flexible display unit by combining a flexible display with a flexible frame according to the present disclosure.

FIG. 15 is a conceptual view for explaining a restoring mechanism of the flexible display unit 10 by the lamination of the flexible frame 100 and the flexible display 11 of the present disclosure.

In this drawing, as illustrated in FIGS. 1 to 11, the second flexible portion 112 is formed on both sides of the first flexible portion 111 to form the flexible region 110. The first flexible portion 111 is configured to be bendable up to a state having a maximum first curvature by the first holes 111' repeatedly formed, and the second flexible portion 112 is configured to be bendable up to a state having a maximum second curvature by the second holes 112' repeatedly formed. Here, the first curvature is set to be larger than the second curvature. In other words, a first curvature radius of the first flexible portion 111 is smaller than a second curvature radius of the second flexible portion 112 in a state where the first and second flexible portions 111, 112 are bent to the maximum.

Referring to FIG. 15A, in a first state where no external force is applied, a interval between the first holes 111' and an interval between the second holes 112' are maintained constant in an unchanged manner. In the first state, the flexible frame 100 is disposed flat, and the flexible display 11 laminated therewith is also disposed flat. In other words, in the first state, the flexible display unit 10 is disposed flat.

Referring to FIG. 15B, a spacing interval between the first and second holes 111', 112' is extended or reduced in a second state in which the flexible display unit 10 is bent to the maximum by an external force. The flexible frame 100 and the flexible display 11 are laminated with each other and an entire length of the flexible frame 100 is not changed, and thus when there is a portion where a spacing interval between the holes is extended, a portion where the spacing interval between the holes is reduced occurs.

As a result, a restoring force is generated due to a property that the first and second holes 111', 112', which are extended or reduced, return to an original spacing interval in the flexible frame 100. By the restoring force, the flexible display unit 10 returns to the first state.

Specifically, a spacing interval between the first holes 111' formed on the first flexible portion 111 is increased, and a restoring force for decreasing the spacing interval between the first holes 111' is generated in the first flexible portion 111. A spacing interval between the second holes 112' formed on the second flexible portion 112 is decreased, and a restoring force for increasing the spacing interval between the second holes 112' is generated in the second flexible portion 112.

The flexible frame 100 is preferably configured to have greater elasticity than the flexible display 11. According to this, when the flexible frame 100 is bent, a restoring force of the flexible display 11 itself is added to a restoring force of the flexible frame 100, thereby improving a restoring force of the flexible display unit 10.

On the other hand, the first curvature is preferably designed to be twice or more the second curvature. In other words, a second curvature radius of the second flexible portion 112 is preferably designed to be twice or more than a first curvature radius of the first flexible portion 111 in a state where the first and second flexible portions 111, 112 are bent to the maximum.

Hereinafter, it will be described which material is suitable for use in the flexible frame 100.

| Type | Yield strength | Elastic modulus | Yield strain | Thickness |
|---|---|---|---|---|
| Beta Titanium | 850 MPa | 80 | 0.01063 | 0.3 mm |
| Titanium Gr2 | 850 MPa | 110 | 0.00773 | 0.3 mm |
| STS 301 EH | 1275 MPa | 200 | 0.006375 | 0.3 mm |

The above table shows a yield strength and a yield strain of titanium and stainless steel.

The relationship between stress and strain seen in a particular material may be represented by a stress-strain curve of the material. The material has a unique stress-strain curve, where the slope denotes a modulus of elasticity.

Yield strength refers to a force capable of withstanding until a material is no longer restored when applying a force to the material. Yield strain refers to a strain at yield strength. Furthermore, an area under the stress-strain curve up to a yield point denotes a restoring force. Therefore, it is seen that as the area increases, a restoring force of the material increases.

In order to allow the flexible frame 100 to withstand repeated bending and restoration, it is preferable that the flexible frame 100 is made of a material having a predetermined level of yield strength and a high yield strain and restoring force.

As can be seen from the table, stainless steel has a high yield strength but a small yield strain, and thus is not suitable for being applied to the flexible frame 100 in which bending and restoring are repeated. On the contrary, it can be seen that titanium has a yield strength lower than that of stainless steel but has a predetermined level of yield strength and a high yield strain. Accordingly, when the flexible frame 100 is formed of a titanium material, it may be bent without breakage, thereby implementing a restorable characteristic.

Various titanium materials such as Beta Titanium and Titanium Gr2 may be used to make the flexible frame 100. Titanium Gr2 is a good choice when looking for relatively inexpensive titanium with a high yield strength and restoring force compared to stainless steel.

In addition, stainless steel is a ferromagnet, which can affect surrounding electronic components, while titanium does not have magnetic properties and thus is more suitable for use in an electronic device such as mobile terminal 1000 in which electronic components are integrated.

Figure 16:
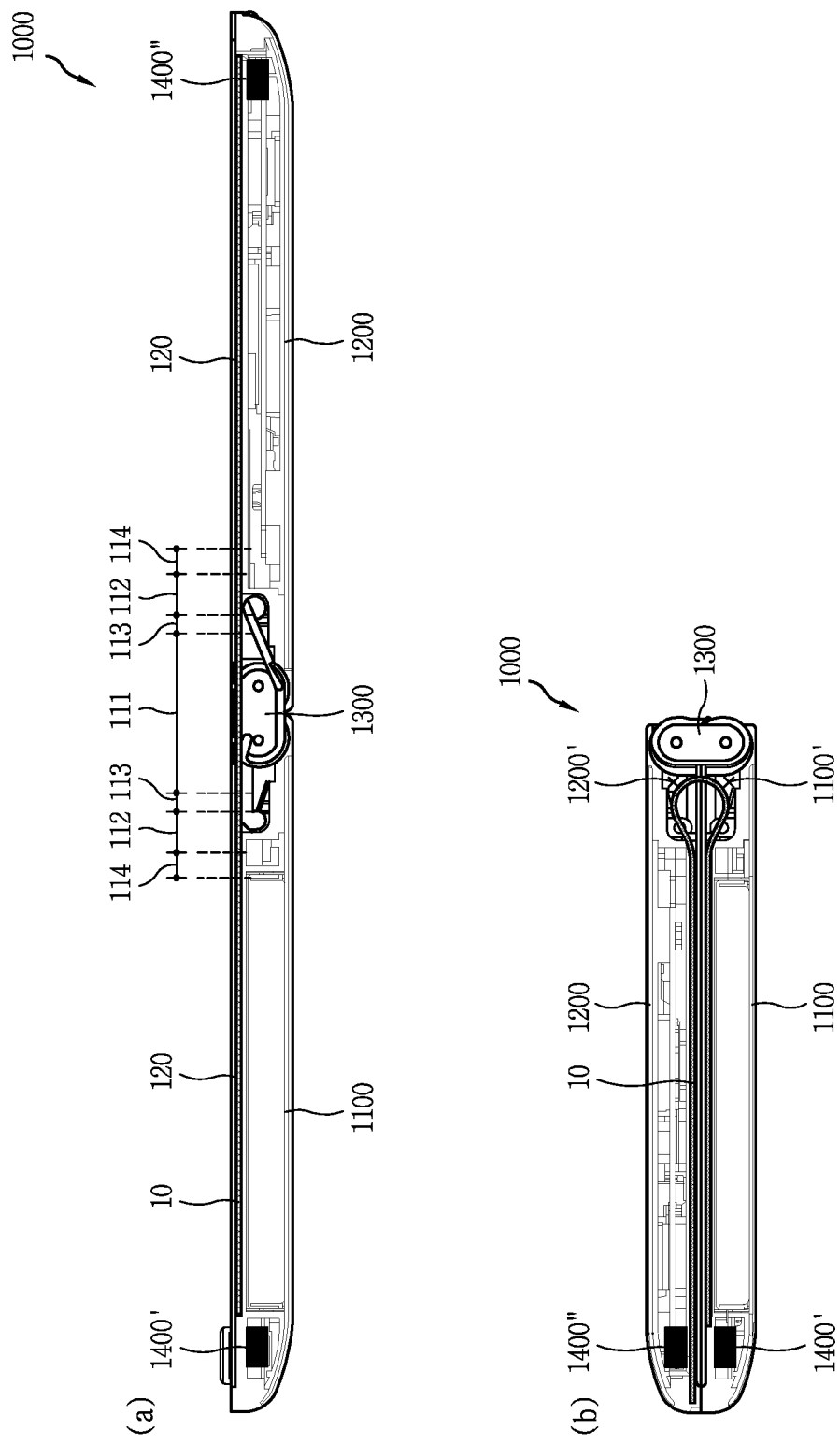
FIG. 16 is a conceptual view illustrating an example of a mobile terminal to which a flexible display unit having the flexible frame shown in FIG. 1 is applied.

FIG. 16 is a conceptual view showing an example of a mobile terminal 1000 to which the flexible display unit 10 having the flexible frame 100 shown in FIG. 1 is applied.

Referring to FIG. 16, the mobile terminal 1000 includes a first body 1100 and a second body 1200 that are configured to be relatively movable. The first body 1100 and the second body 1200 may have the same size.

FIG. 16A shows a first state in which the first body 1100 and the second body 1200 are arranged in parallel, and FIG. 16B shows a second state in which the second body 1200 is folded over the first body 1100. The mobile terminal 1000 is configured to freely modify its form from a first state to a second state, or from a second state to a first state.

In order to implement this, the first body 1100 and the second body 1200 may be respectively connected to the hinge portion 1300, and configured to be rotatable with respect to the hinge portion 1300.

Referring to FIG. 16A, the flexible display unit 10 is disposed on one surface of the first body 1100 and on one surface of the second body 1200. In other words, the flexible display unit 10 is disposed over the first body 1100 and the second body 1200, thereby implementing a large screen. The flexible display unit 10 is disposed to cover the hinge portion 1300.

The first flexible portion 111 of the flexible frame 100 is disposed to cover the hinge portion 1300, and the second flexible portion 112 is disposed to cover the end portions of the first body 1100 and the second body 1200. The first flexible portion 111 may be formed in the middle portion of the flexible frame 100. The rigid portion 120 is disposed to cover the first body 1100 and the second body 1200 to support the flexible display 11 in a flat state.

Referring to FIG. 16B, when the second body 1200 is folded over the first body 1100, the flexible display unit 10 is bent by an external force. The first flexible portion 111 is bent at a first curvature, the second flexible portion 112 is bent at a second curvature, and the rigid portions 120 are arranged to face each other. Accordingly, the portions of the flexible display 11 supported by the rigid portion 120 are arranged to face each other.

The center of a curvature radius of the first flexible portion 111 is located in an inner space formed by the folding of the flexible frame 100 and the center of a curvature radius of the second flexible portion 112 is located in an outer space formed by the folding of the flexible frame 100, and thus the flexible frame 100 is bent in a shape as shown in FIG. 16B. Considering such a shape change, recessed spaces 1100', 1200' in which a part of the flexible display unit 10 corresponding to the first and second flexible portions 111, 112 can be received may be formed in the first and second bodies 1100, 1200.

As shown in the drawing, the recessed spaces 1100', 1200' may be configured to be blocked by mechanically interlocking the first and second bodies 1100 and 1200 with the hinge portion 1300 in the first state shown in FIG. 16A. In other words, the recessed spaces 1100', 1200' may be formed only in the second state shown in FIG. 16B.

On the other hand, in the second state shown in FIG. 16B, the first and second bodies 1100, 1200 are subjected to a force to return to the first state shown in FIG. 16A by a restoring force of the flexible display unit 10. Accordingly, in order to maintain the second state shown in FIG. 16B, the first body 1100 and the second body 1200 may be provided with magnet portions 1400', 1400 which exert attractive forces on each other.

The magnet portions 1400', 1400' may be disposed at each end portion of the first and second bodies 1100, 1200 to face each other in a folded state. The attractive force exerted by the magnet portions 1400', 1400 is set to be larger than a restoring force of the flexible display unit 10. Therefore, the mobile terminal 1000 cannot return to the state of FIG. 16A only by a restoring force of the flexible display unit 10.

However, when a force for moving the first body 1100 and the second body 1200 away from each other is (instantaneously) applied, and a sum force of the force and a restoring force of the flexible display unit 10 is larger than an attractive force of the magnet portions 1400' 1400, the mobile terminal 1000 can be returned to the state of FIG. 16A only by the restoring force of the flexible display unit 10 thereafter.

Hereinafter, various other examples will be described in order to show that the flexible frame 100 can have various forms.

Figure 17:
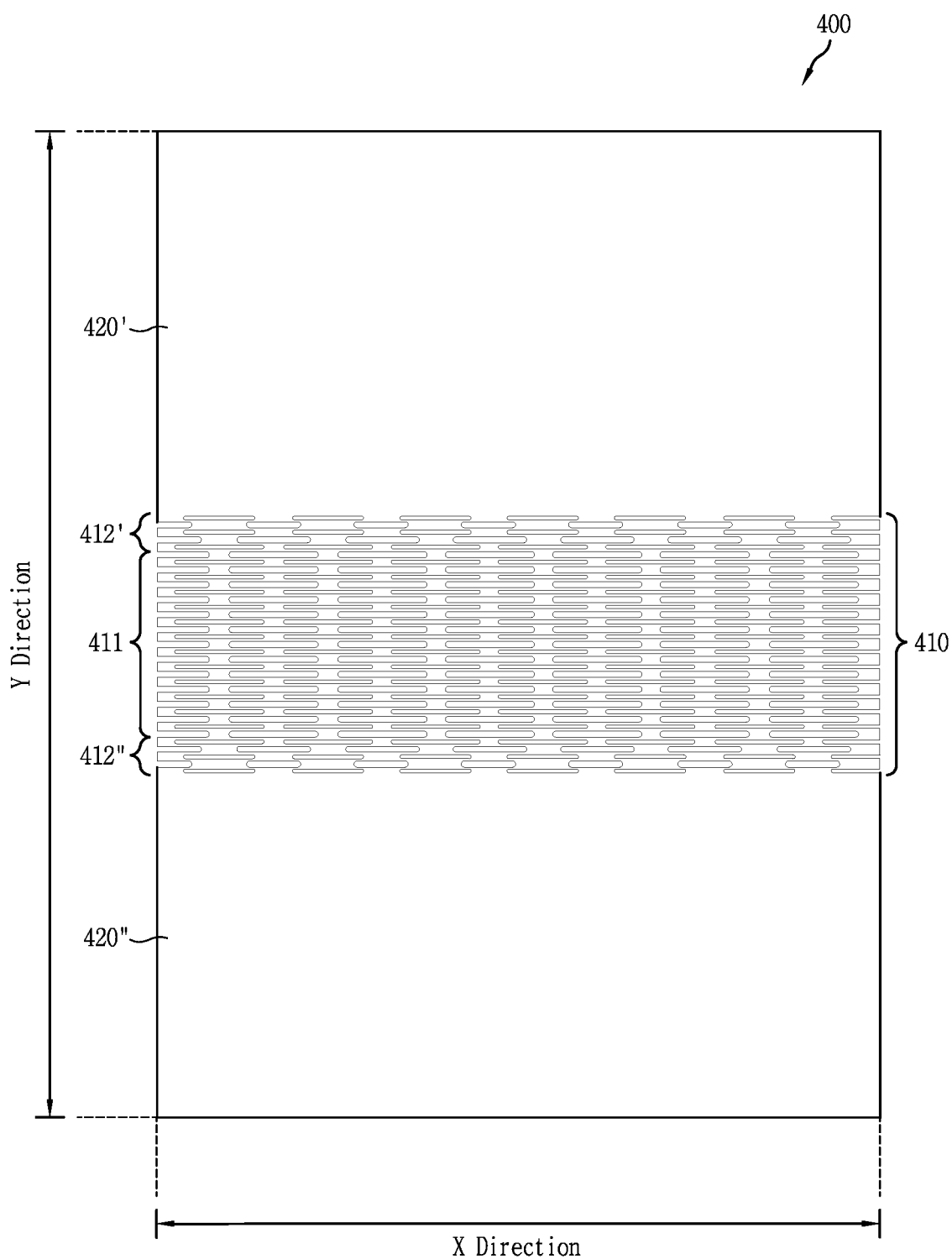
FIG. 17 is a view showing another example of a flexible frame of the present disclosure.
Figure 18:
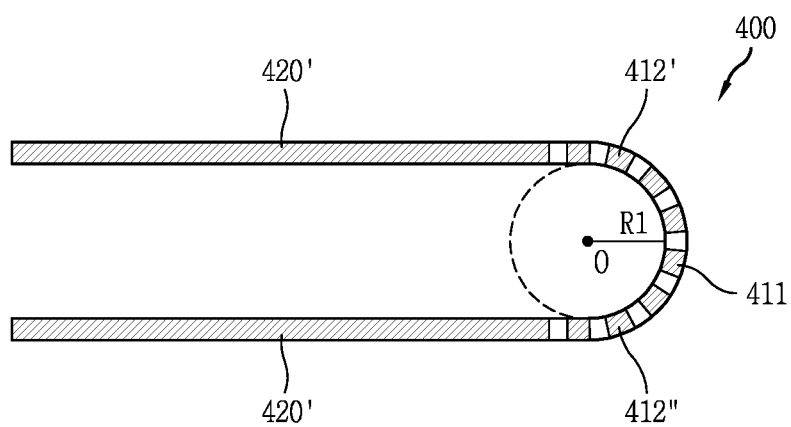
FIG. 18 is a conceptual view showing a state in which a flexible portion of the flexible frame shown in FIG. 17 is bent at a maximum curvature.
Figure 19:
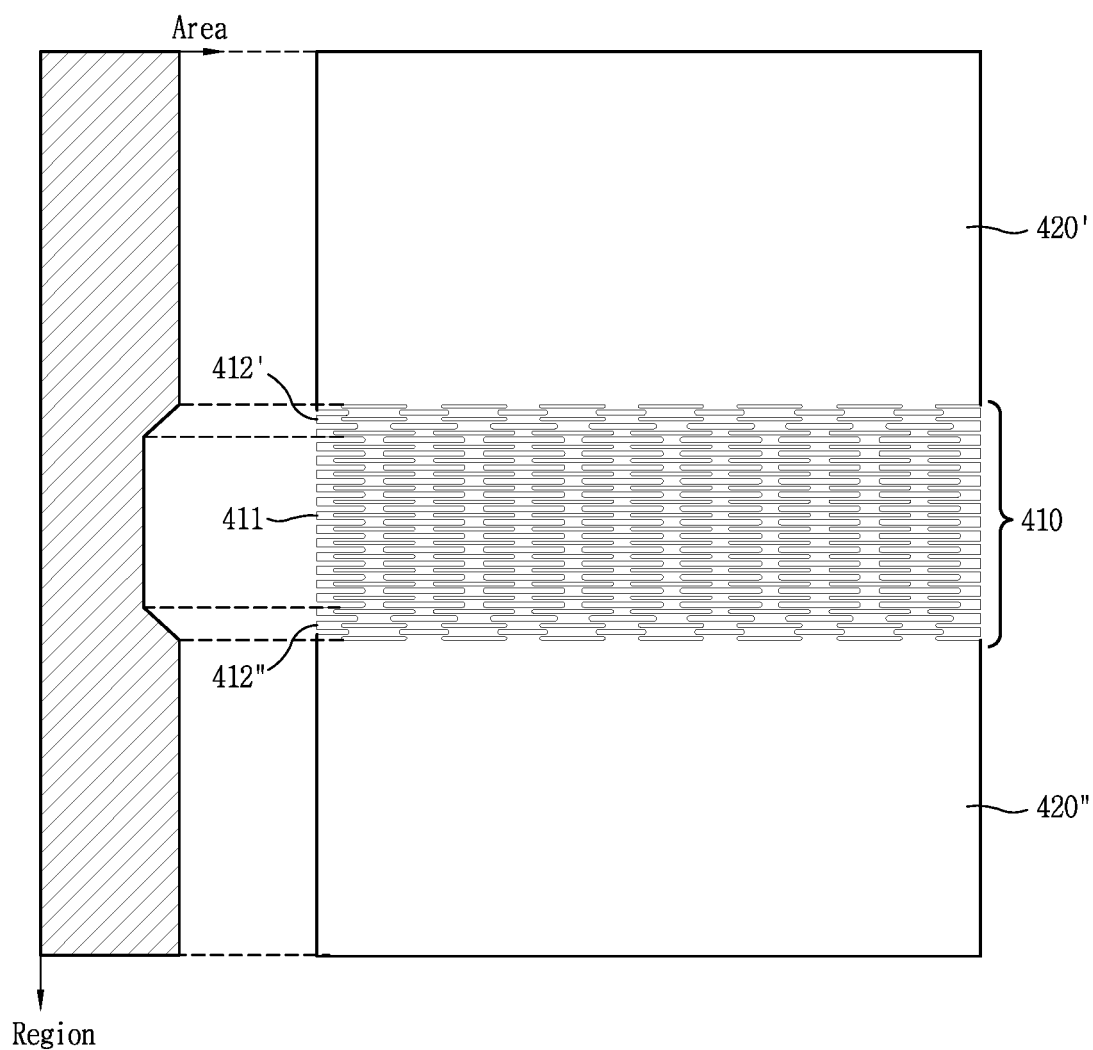
FIG. 19 is a conceptual view showing a Y direction area change of the flexible frame shown in FIG. 17.
Figure 20:
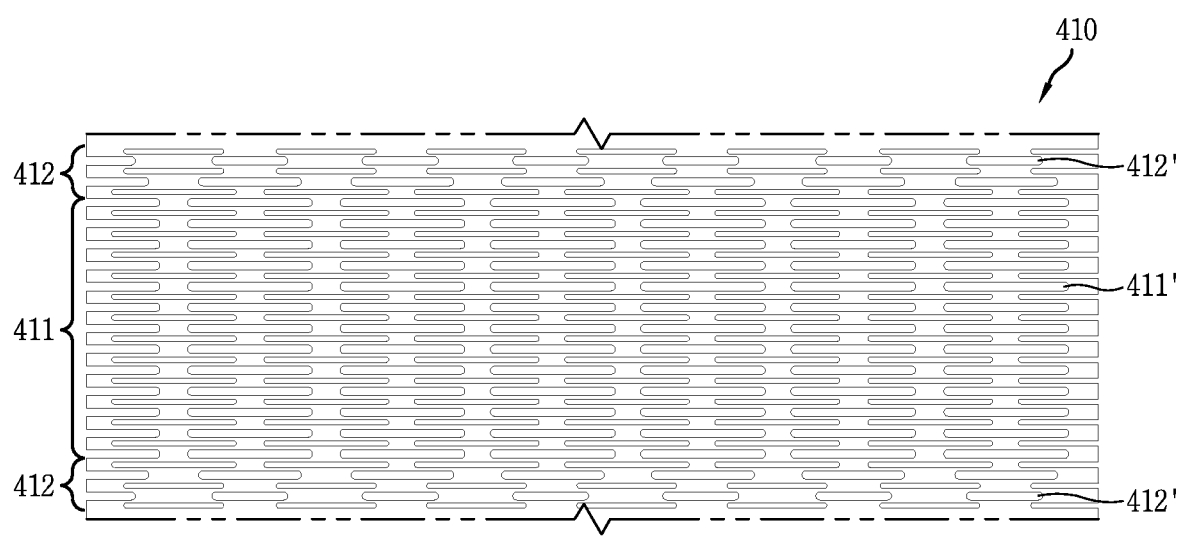
FIG. 20 is an enlarged view of a flexible region shown in FIG. 17.

FIG. 17 is a view showing another example of a flexible frame 400 of the present disclosure, and FIG. 18 is a conceptual view showing a state in which each flexible portion of the flexible frame 400 shown in FIG. 17 is bent at a maximum curvature, and FIG. 19 is a conceptual view showing a Y direction area change of the flexible frame 400 shown in FIG. 17, and FIG. 20 is an enlarged view of a flexible region 410 shown in FIG. 17.

Referring to FIGS. 17 to 20, the flexible frame 400 includes a flexible portion 411, a first rigid portion 420' and a second rigid portion 420" disposed on both sides of the flexible portion 411, a first boundary portion 412' disposed between the flexible portion 411 and the first rigid portion 420' and a second boundary portion 412" disposed between the flexible portion 411 and the second rigid portion 420". Here, the flexible portion 411 and the first and second boundary portions 412', 412" form the flexible region 410.

The flexible region 410 is configured to be bent with respect to the Y direction. Here, the X direction corresponds to a widthwise direction of the flexible frame 400, and the Y direction corresponds to a lengthwise direction of the flexible frame 400.

The flexible portion 411 is configured to be bendable up to a state having a maximum first curvature. First holes 411' are repeatedly formed on the flexible portion 411 to implement the bending of the flexible portion 411. In other words, flexibility may be generated on the flexible portion 411 due to the first holes 411', and the flexible portion 411 may be bent up to a state having the maximum first curvature.

The first holes 411' are repeatedly formed along the X and Y directions intersecting each other. The first holes 411' are extended in an elongated manner in the X direction.

First and second rigid portions 420', 420" are respectively disposed on both sides of the flexible portion 411 in the Y direction. The first and second rigid pots 420', 420" may be formed in a plane that is hardly bent by an external force. Intentional holes are not formed on the first and second rigid portions 420', 420" to implement bending. In a state where the flexible portion 411 is bent to the maximum, the first and second rigid portions 420', 420" are arranged to face each other.

Between the flexible portion 411 and the first rigid portion 420', and between the flexible portion 411 and the second rigid portion 420", first and second boundary portions 412', 412" for smoothly connecting them are respectively formed. The second and third holes 412', 412" are formed on the first and second boundary portions 412', 412" so that the first and second boundary portions 412', 412" are bendable with respect to the Y direction. The second and third holes 412', 412" may be extended in an elongated manner in the X direction and disposed in parallel with the first holes 411'.

A degree of bending of the first and second boundary portions 412', 412" may be achieved by changing a total area occupied by the second and third holes 412', 412" per unit area of the first and second boundary portions 412', 412".

The first and second boundary portions 412', 412" are configured to be less bendable than the flexible portions 411. For this purpose, a total area occupied by the second and third holes 412', 412" per unit area in the first and second boundary portion 412', 412" is set to be smaller than a total area occupied by the first holes 411' per unit area in the flexible portion 411.

For this purpose, a length of each of the second and third holes 412', 412" may be set to be smaller than that of the first holes 411'. Alternatively, a spacing interval between the second and third holes 412', 412" may be set to be larger than that between the first holes 411'.

The second and third holes 412', 412" may be arranged in a zigzag manner while partially overlapping each other along the Y direction. As shown in the drawing, the second and third holes 412', 412" arranged along the X direction are disposed in the Y direction directly above or below a region between the second and third holes 412', 412" arranged along the X direction (a region where an inherent material of the rigid flexible frame 400 remains).

Here, a length of a mutually overlapping portion between the second and third holes 412', 412" along the Y direction is set to be smaller than that of a mutually overlapping portion of the first holes 411'.

A maximum curvature at one end portion of the first and second boundary portions 412', 412" adjacent to the flexible portion 411 may be set to be greater than a maximum curvature at the other end portion of the first and second bound portions 412', 412" adjacent to the first and second rigid portions 420', 420". In other words, the maximum curvature at one end portion of the first and second boundary portions 412', 412" may be set to be smaller than the first curvature, and the maximum curvature at the other end portion of the first and second boundary portions 412', 412" may be set to be greater than zero.

To this end, a length of a hole adjacent to the flexible portion 411 of among the second and third holes 412', 412" may be set to be larger than that of a hole adjacent to the first and second rigid portions 420', 420". Alternatively, a spacing interval between the second and third holes 412', 412" at a portion adjacent to the flexible portion 411 may be set to be smaller than that between the second and third holes 412', 412" at a portion adjacent to the first and second rigid portions 420', 420".

Alternatively, the second and third holes 412', 412" may be randomly arranged under the condition that a total area occupied by the second and third holes 412', 412" per unit area in the first and second boundary portions 412', 412" is set to be smaller than a total area occupied by the first holes 411' per unit area in the flexible portion 411.

FIG. 18 shows a view in which the flexible portion 411 is bent to the maximum. As shown in the drawing, the center of a curvature radius of the flexible portion 411 is located in an inner space formed by the folding of the flexible frame 400.

Figure 21:
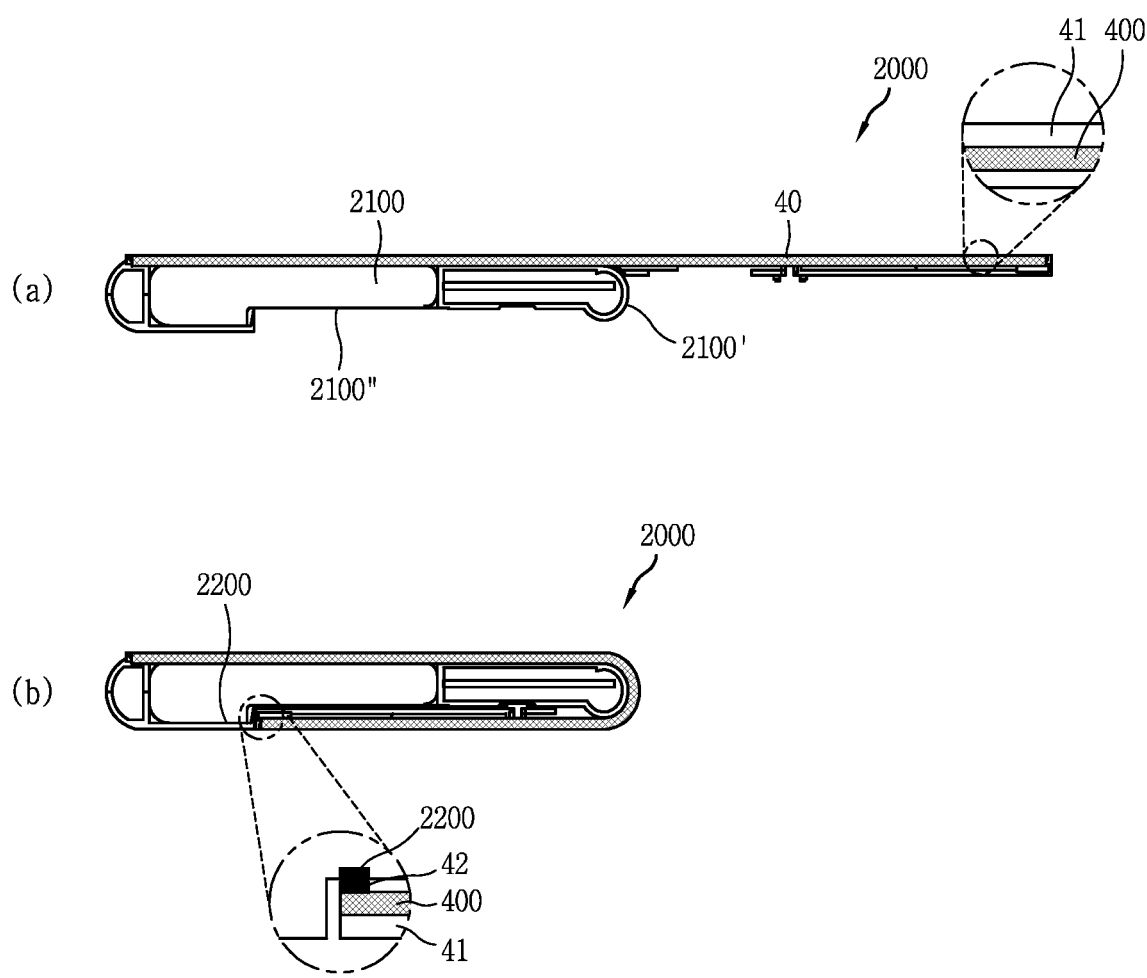
FIG. 21 is a conceptual view illustrating an example of a mobile terminal to which a flexible display unit having the flexible frame shown in FIG. 17 is applied.

FIG. 21 is a conceptual view showing an example of a mobile terminal 2000 to which the flexible display unit 40 having the flexible frame 400 shown in FIG. 17 is applied.

The flexible display unit 40 is formed in an elastically deformable manner, and includes a flexible display 41 and the foregoing flexible frame 400. The flexible display 41 and the flexible frame 400 may be coupled to each other by a laminated structure described above in FIGS. 12 to 14.

FIG. 21A shows a first state in which the flexible display unit 40 is folded flat on one surface of the terminal body 2100, and FIG. 21B shows a second state in which the flexible display unit 40 is folded so that part thereof is disposed on the other surface of the terminal body 2100. The flexible display unit 40 is configured to freely modify its form from a first state to a second state, or from a second state to a first state.

In order to implement this, the first rigid portion 420' is configured to be attached onto one surface of the terminal body 2100, and the first boundary portion 412', the flexible portion 411, the second boundary portion 412", and the second rigid portion 420" are configured to be detachable from the terminal body 2100.

A round portion 2100' is formed at one end portion of the terminal body 2100 to guide the modification of its shape such that the first boundary portion 412', the flexible portion 411 and the second boundary portion 412" can be bent in a corresponding manner to the round portion 2100'. A degree of bending, namely, a curvature, of the round portion 2100', is preferably set to be equal to or smaller than a first curvature which is the maximum curvature at which the flexible portion 411 can be bent.

When the first boundary portion 412', the flexible portion 411 and the second boundary portion 412" are bent in a corresponding manner to the round portion 2100', the second rigid portion 420" is disposed to cover the other surface of the terminal body 2100. A recess portion 2100" capable of accommodating a portion of the flexible display unit 40 corresponding to the second rigid portion 420" may be formed on the other surface of the terminal body 2100. In a state where a portion of the flexible display unit 10 corresponding to the second rigid portion 120 is accommodated in the recess portion 2100", an upper surface of the one portion may form the same plane as the other surface of the terminal body 2100.

On the other hand, in the second state shown in FIG. 21B, the flexible display unit 40 is subjected to a force of returning to the first state shown in FIG. 21A by a restoring force of the flexible frame 400. Accordingly, in order to maintain the second state shown in FIG. 21B, one end portion of the flexible display unit 40 and the terminal body 2100 may be provided with magnet portions 42, 2200 which exert attractive forces on each other.

The magnet portions 42, 2200 are provided on the other side of the second rigid portion 420' and the terminal body 2100 so that the flexible display unit 40 can be dispose to face each other in a folded state. The attractive force exerted by the magnet portions 42, 2200 is set to be larger than a restoring force of the flexible display unit 40. Therefore, the flexible display unit 40 cannot return to the state of FIG. 21A only by a restoring force of the flexible display unit 40.

However, when a force for detaching the second rigid portion 420" from the other side of the terminal body is (instantaneously) applied by a user, and a sum force of the force and a restoring force of the flexible display unit 40 is larger than an attractive force due to the magnet portions 42, 2200, the flexible display unit 40 can be returned to the state of FIG. 21A only by the restoring force of the flexible display unit 40 thereafter.

FIG. 22 is a conceptual view showing an example of a mobile terminal 3000 to which a flexible display unit 50 having another example of the flexible frame 500 of the present disclosure is applied.

Referring to FIG. 22A, the flexible frame 500 of the present example may be provided with two flexible regions 510', 510". The flexible region 510' at an upper portion of the drawing is the same as a structure of the flexible frame 100 shown above in FIG. 1, and the flexible region 510" at a lower portion of the drawing is the same as a structure of the flexible frame 400 shown above in FIG. 17. Therefore, the description of the structure of the flexible frame 500 will be substituted by the earlier description.

Referring to FIG. 22B, a mobile terminal 3000 includes a first body 3100, a second body 3200 and a third body 3300 which are configured to be relatively movable. The first body 3100, the second body 3200, and the third body 3300 may have the same size.

In a first state in which the first body 3100, the second body 3200 and the third body 3300 are unfolded flat, the flexible display unit 50 are disposed over the first body 3100, the second body 3200, and the third body 3300 to constitute a large screen.

In a second state in which the first body 3100, the second body 3200 and the third body 3300 are sequentially folded as shown in FIG. 22B, the flexible display unit 50 is also folded in a corresponding manner thereto.

The mobile terminal 3000 is configured to freely modify its form from a first state to a second state, or from a second state to a first state.

In order to achieve this, the first body 3100 and the second body 3200 may be respectively connected to a first hinge portion 3000' to be rotatable with respect to the first hinge portion 3000', and the second body 3200 and the third body 3300 may be respectively connected to a second hinge portion 3000" to be rotatable with respect to the second hinge portion 3000".

The description of each structure will be substituted by the earlier description of FIGS. 16 and 21.

Figure 23:
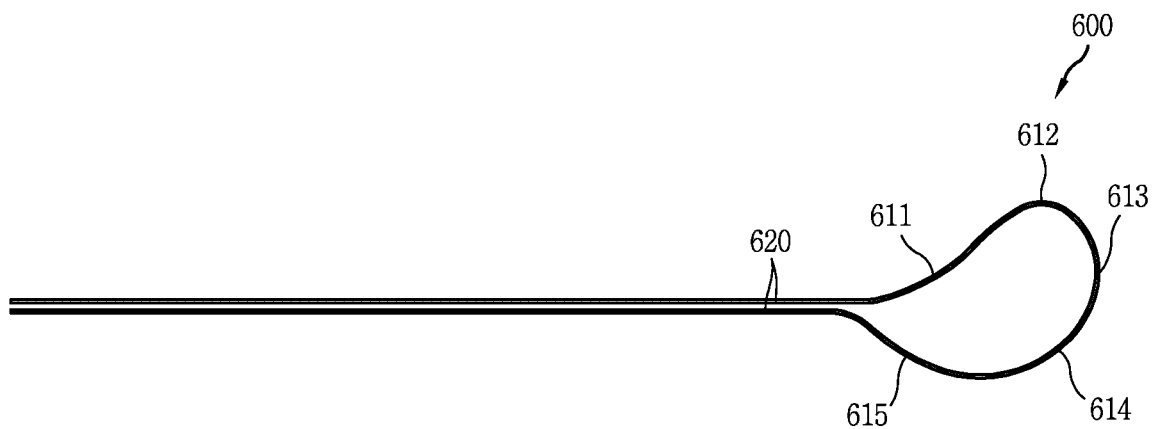
FIG. 23 is a conceptual view showing still another example of a flexible frame of the present disclosure.

FIG. 23 is a conceptual view showing still another example of the flexible frame 600 of the present disclosure.

Referring to FIG. 23, at least one or more flexible portions 611, 612, 613, 614, 615 may be provided in the flexible frame 600. Here, the flexible portions 611, 612, 613, 614, 615 may have an asymmetric shape.

In other words, in FIG. 1, the second flexible portions 112 having the same maximum curvature are formed to have the same length on both sides of the first flexible portion 111 to have a shape symmetrical with respect to the center of the first flexible portion 111, but a shape of the flexible frame 100 is not limited to such a symmetric shape.

A degree to which each of the plurality of flexible portions 611, 612, 613, 614, 615 is bendable to the maximum, namely, a maximum curvature, may be designed to have a different value. Furthermore, the lengths of the plurality of flexible portions 611, 612, 613, 614, 615 may be designed to be different.

In this drawing, it is shown that five flexible portions 611, 612, 613, 614, 615 are designed to have different maximum curvatures, and their lengths are also set to be different.

What is claimed is:

1. A flexible display unit, comprising: a flexible display formed to be elastically deformed; and a flexible frame coupled to a rear surface of the flexible display, wherein the flexible frame comprises: a flexible portion in which first holes are repeatedly formed to be bendable up to a state having a maximum first curvature; and a rigid portion disposed on at least one side of the flexible portion, and wherein the flexible frame is formed of a titanium material, and wherein an adhesive portion disposed between the flexible display and the flexible frame; and a silicon portion filled in the first holes.

2. The flexible display unit of claim 1, wherein when the flexible display is deformed, an interval between the first holes is enlarged or reduced to apply a restoring force to the flexible display.

3. The flexible display unit of claim 1, wherein an adhesive portion is disposed between the flexible display and the flexible frame, and a part of the adhesive portion is exposed rearward through the first holes.

4. The flexible display unit of claim 1, further comprising: an adhesive portion disposed on a rear surface of the flexible display; and a silicon portion disposed between the adhesive portion and the flexible frame, wherein the silicon portion comprises: a first portion disposed on the flexible portion and the rigid portion; and a second portion filled in the first holes.

5. The flexible display unit of claim 4, wherein the second portion forms the same plane as the rear surface of the flexible frame.

6. The flexible display unit of claim 4, wherein the silicon portion is integrally formed with the flexible frame by insert injection.

7. The flexible display unit of claim 1, wherein the silicon portion is brought into contact with a part of the adhesive portion exposed through the first holes.

8. The flexible display unit of claim 1, wherein the silicon portion forms the same plane as the rear surface of the flexible frame.

9. The flexible display unit of claim 1, wherein the silicon portion is integrally formed with the flexible frame by insert injection.

10. The flexible display unit of claim 1, wherein the flexible frame further comprises: a boundary portion in which second holes parallel to the first holes are repeatedly formed between the flexible portion and the rigid portion, wherein a total area occupied by the second holes per unit area is smaller than a total area occupied by the first holes per unit area in the flexible portion.

11. The flexible display unit of claim 10, a length of each of the second holes is shorter than that of each of the first holes.

12. The flexible display unit of claim 10, wherein the first and second holes are respectively formed in a repetitive manner along a widthwise direction and a lengthwise direction of the flexible frame intersecting each other, and an interval between the second holes extended in a widthwise direction of the flexible frame is larger than that between the first holes.

13. A flexible display unit, comprising: a flexible display formed to be elastically deformed; and a flexible frame coupled to a rear surface of the flexible display, wherein the flexible frame comprises: a first flexible portion in which first holes are repeatedly formed to be bendable up to a state having a maximum first curvature; a second flexible portion in which second holes parallel to the first holes are repeatedly formed on one side of the first flexible portion, and configured to be bendable up to a state having a maximum second curvature; and a third flexible portion in which third holes parallel to the first holes are repeatedly formed on the other side of the first flexible portion, and configured to be bendable up to a state having a maximum third curvature; and wherein the first curvature is at least two times the second and third curvatures.

14. The flexible display unit of claim 13, wherein a total area occupied by the first holes per unit area in the first flexible portion is larger than a total area occupied by the second holes per unit area in the second flexible portion and a total area occupied by the third holes per unit area in the third flexible portion.

15. The flexible display unit of claim 13, wherein the second flexible portion and the third flexible portion are formed symmetrically with respect to the first flexible portion so that the second curvature and the third curvature are the same.

16. The flexible display unit of claim 13, wherein first and second rigid portions for supporting the flexible display in a flat state are disposed on one side of the second flexible portion and the third flexible portion, respectively, and the first and second rigid portions are disposed to face each other while the first to third flexible portions are bent at the first to third curvatures, respectively.

17. The flexible display unit of claim 16, further comprising: a first boundary portion in which fourth holes are repeatedly formed between the second flexible portion and the first rigid portion, wherein a total area occupied by the fourth holes per unit area is smaller than a total area occupied by the second holes per unit area in the second flexible portion; and a secondary boundary portion in which fifths hole are repeatedly formed between the third flexible portion and the second rigid portion, wherein a total area occupied by the fifth holes per unit area is smaller than a total area occupied by the third holes per unit area in the third flexible portion.

18. The flexible display unit of claim 17, further comprising: a first connecting portion in which sixth holes parallel to the first and second holes are repeatedly formed between the first flexible portion and the second flexible portion, wherein a total area occupied by the sixth holes per unit area is smaller than a total area occupied by the first holes per unit area in the first flexible portion and larger than a total area occupied by the second holes per unit area in the second flexible portion; and a second connecting portion in which seventh holes parallel to the first and third holes are repeatedly formed between the first flexible portion and the third flexible portion, wherein a total area occupied by the seventh holes per unit area is smaller than a total area occupied by the first holes per unit area in the first flexible portion and larger than a total area occupied by the third holes per unit area in the third flexible portion.

19. A mobile terminal, comprising: a terminal body formed of an elastically deformable material; a flexible display unit coupled to one surface of the terminal body and configured to be elastically deformable together with the terminal body; and magnet portions provided at both ends of the terminal body disposed to face each other in a state where the first to third flexible portions are bent at the first to third curvatures, respectively, to exert attractive forces on each other, wherein the flexible display unit comprises: a flexible display formed to be elastically deformed; and a flexible frame coupled to a rear surface of the flexible display, wherein the flexible frame comprises: a first flexible portion in which first holes are repeatedly formed to be bendable up to a state having a maximum first curvature; a second flexible portion in which second holes parallel to the first holes are repeatedly formed on one side of the first flexible portion, and configured to be bendable up to a state having a maximum second curvature; and a third flexible portion in which third holes parallel to the first holes are repeatedly formed on the other side of the first flexible portion, and configured to be bendable up to a state having a maximum third curvature, wherein the first curvature is at least two times the second and third curvatures, wherein first and second rigid portions for supporting the flexible display in a flat state are disposed on one side of the second flexible portion and the third flexible portion, respectively, and wherein the first and second rigid portions are disposed to face each other while the first to third flexible portions are bent at the first to third curvatures, respectively.

* * * * *